US012750061B2

(12) United States Patent
Lim et al.

(10) Patent No.: US 12,750,061 B2
(45) Date of Patent: Sep. 29, 2026

(54) PHASE-LOCKED LOOP DEVICE, AND OPERATING METHOD OF THE DEVICE

(71) Applicant: SAMSUNG ELECTRONICS CO., LTD., Suwon-si (KR)

(72) Inventors: Dokyung Lim, Suwon-si (KR); Junhyeok Yang, Suwon-si (KR); Chanyoung Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 75 days.

(21) Appl. No.: 18/904,828

(22) Filed: Oct. 2, 2024

(65) Prior Publication Data

US 2025/0211239 A1 Jun. 26, 2025

(30) Foreign Application Priority Data

Dec. 22, 2023 (KR) ........................ 10-2023-0190072

(51) Int. Cl.
*H03L 7/089* (2006.01)
*H03L 7/099* (2006.01)
(Continued)

(52) U.S. Cl.
CPC ............ *H03L 7/0895* (2013.01); *H03L 7/099* (2013.01); *H03L 7/1077* (2013.01); *H03L 7/18* (2013.01); *H03K 19/20* (2013.01)

(58) Field of Classification Search
CPC ..... H03L 7/0895; H03L 7/099; H03L 7/1077; H03L 7/18; H03K 19/20
(Continued)

(56) References Cited

U.S. PATENT DOCUMENTS 5,057,793 A 10/1991 Cowley et al.
9,197,224 B2 11/2015 Kinget et al.
(Continued)

FOREIGN PATENT DOCUMENTS

CN 112865788 B 8/2022
CN 114095016 B 1/2023

OTHER PUBLICATIONS

Communication dated Apr. 11, 2025, issued by the European Patent Office in counterpart European Application No. 24207514.1.
(Continued)

*Primary Examiner* — Tomi Skibinski
(74) *Attorney, Agent, or Firm* — Sughrue Mion, PLLC

(57) ABSTRACT

A phase-locked loop device and a method for operating the same, including: a voltage-controlled oscillator configured to generate an output clock signal; a divider configured to divide the output clock signal into a first phase division signal; a sampling phase frequency detector configured to: receive a first supply voltage, a second supply voltage different from the first supply voltage, and the first phase division signal, and based on determining that a phase difference between the first phase division signal and a reference clock signal corresponds to a first interval, output a hold voltage and a status signal for the phase difference; a transconductance circuit configured to output a first conversion current based on the hold voltage; a charge pump configured to output a second conversion current based on the status signal; and a loop filter configured to provide a voltage control signal to the voltage-controlled oscillator.

20 Claims, 17 Drawing Sheets

1

(51) Int. Cl.
*H03L 7/107* (2006.01)
*H03L 7/18* (2006.01)
*H03K 19/20* (2006.01)

(58) Field of Classification Search
USPC .................................................. 327/156–158
See application file for complete search history.

(56) References Cited

U.S. PATENT DOCUMENTS

| | | | |
|---|---|---|---|
| 9,608,644 B1 | 3/2017 | Raj et al. | |
| 9,742,380 B1 | 8/2017 | Raj et al. | |
| 10,418,981 B2 | 9/2019 | Loke et al. | |
| 10,651,858 B2 | 5/2020 | Ott et al. | |
| 10,879,914 B1 * | 12/2020 | Jung | H03L 7/091 |
| 11,431,344 B2 | 8/2022 | Zuo et al. | |
| 2012/0235718 A1 * | 9/2012 | Thakur | H03L 7/0891 327/157 |
| 2013/0156076 A1 | 6/2013 | Kinget et al. | |
| 2018/0302069 A1 | 10/2018 | Loke et al. | |
| 2019/0165794 A1 | 5/2019 | Ott et al. | |
| 2021/0013888 A1 | 1/2021 | Kim et al. | |
| 2021/0021273 A1 | 1/2021 | Jung et al. | |
| 2021/0313995 A1 * | 10/2021 | Zuo | H03L 7/0996 |
| 2023/0122691 A1 * | 4/2023 | Kim | H03L 7/099 327/156 |
| 2023/0370072 A1 * | 11/2023 | Wang | H03L 7/0895 |

OTHER PUBLICATIONS

Liao Dongyi et al., "A Fractional-N Reference Sampling PLL With Linear Sampler and CDAC Based Fractional Spur Cancellation," IEEE Journal of Solid-State Circuits, vol. 56, No. 3, Mar. 2021, pp. 694-704.

* cited by examiner

12

PHASE-LOCKED LOOP DEVICE, AND OPERATING METHOD OF THE DEVICE

CROSS-REFERENCE TO RELATED APPLICATION

This application is based on and claims priority under 35 U.S.C. § 119 to Korean Patent Application No. 10-2023-0190072 filed on Dec. 22, 2023, in the Korean Intellectual Property Office, the disclosure of which is incorporated by reference herein in its entirety.

BACKGROUND

1. Field

The disclosure relates to a phase-locked loop device and a method of operating the device.

2. Description of Related Art

In the field of $5^{th}$ generation (5G) communication technology, the need for a phase-locked loop (PLL) with high data rate (HDR) and high-performance jitter removal specifications has increased.

In general, for phase-locked loops that include a charge pump, it may be difficult to achieve fast frequency and jitter specifications required by 5G standards.

Some approaches for achieving the fast frequency and jitter specifications required by 5G standards may use sampling PLLs such as subsampling PLLs.

However, in the case of a sampling PLL, the lock range for achieving phase lock may be relatively narrow, making it difficult to achieve stable phase lock.

In order to secure a fixed range, in addition to the main loop, a separate loop such as a frequency locking loop may be added to the sampling PLL, which may cause difficulties in reducing manufacturing costs and achieving integration.

SUMMARY

Provided is a phase-locked loop device and operating method that secures a wide fixation range with only the main loop.

Also provided is a phase-locked loop device and operating method that secures proportional gain in a wide range with only the main loop.

Additional aspects will be set forth in part in the description which follows and, in part, will be apparent from the description, or may be learned by practice of the presented embodiments.

In accordance with an aspect of the disclosure, a phase-locked loop device includes: a voltage-controlled oscillator configured to generate an output clock signal; a divider configured to divide the output clock signal into a first phase division signal; a sampling phase frequency detector configured to: receive a first supply voltage, a second supply voltage different from the first supply voltage, and the first phase division signal, and based on determining that a phase difference between the first phase division signal and a reference clock signal corresponds to a first interval, output a hold voltage based on the first supply voltage or the second supply voltage, and output a status signal for the phase difference; a transconductance circuit configured to output a first conversion current based on the hold voltage; a charge pump configured to output a second conversion current based on the status signal; and a loop filter configured to provide a voltage control signal corresponding to the first conversion current and the second conversion current to the voltage-controlled oscillator.

In accordance with an aspect of the disclosure, a method for operating a phase-locked loop device includes: receiving a reference clock signal and a first phase division signal divided from an output clock signal; generating a hold voltage based on a phase difference between the first phase division signal and the reference clock signal; generating a first conversion current based on the hold voltage; generating a status signal based on whether the phase difference is included in a predetermined interval; generating a second conversion current based on the status signal; providing a voltage control signal based on a conversion current including the first conversion current and the second conversion current; and providing the output clock signal based on the voltage control signal.

In accordance with an aspect of the disclosure, a phase-locked loop device includes: a first circuit including: a first flip-flop configured to output a first latch signal as a first selection signal based on a first adjustment clock signal, wherein a phase of the first adjustment clock signal is adjusted from a reference clock signal, a second flip-flop configured to output a second latch signal as a second selection signal based on a second adjustment clock signal, wherein a phase of the second adjustment clock signal is adjusted from the reference clock signal, a first AND gate configured to perform an AND operation on the first latch signal and the first selection signal to output a first status signal, a second AND gate configured to perform an AND operation on the second latch signal and the second selection signal to output a second status signal, and a NOR gate configured to perform a NOR operation on the first selection signal and the second selection signal to output a third selection signal; a second circuit including: a sampling phase detection circuit configured to provide a sampling voltage to the hold node based on the third selection signal, an up switch configured to provide a first supply voltage to a hold node based on the first selection signal, and a down switch configured to provide a second supply voltage different from the first supply voltage to the hold node based on and the second selection signal; and a charge pump configured to output at least a portion of a conversion current based on the first status signal and the second status signal.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
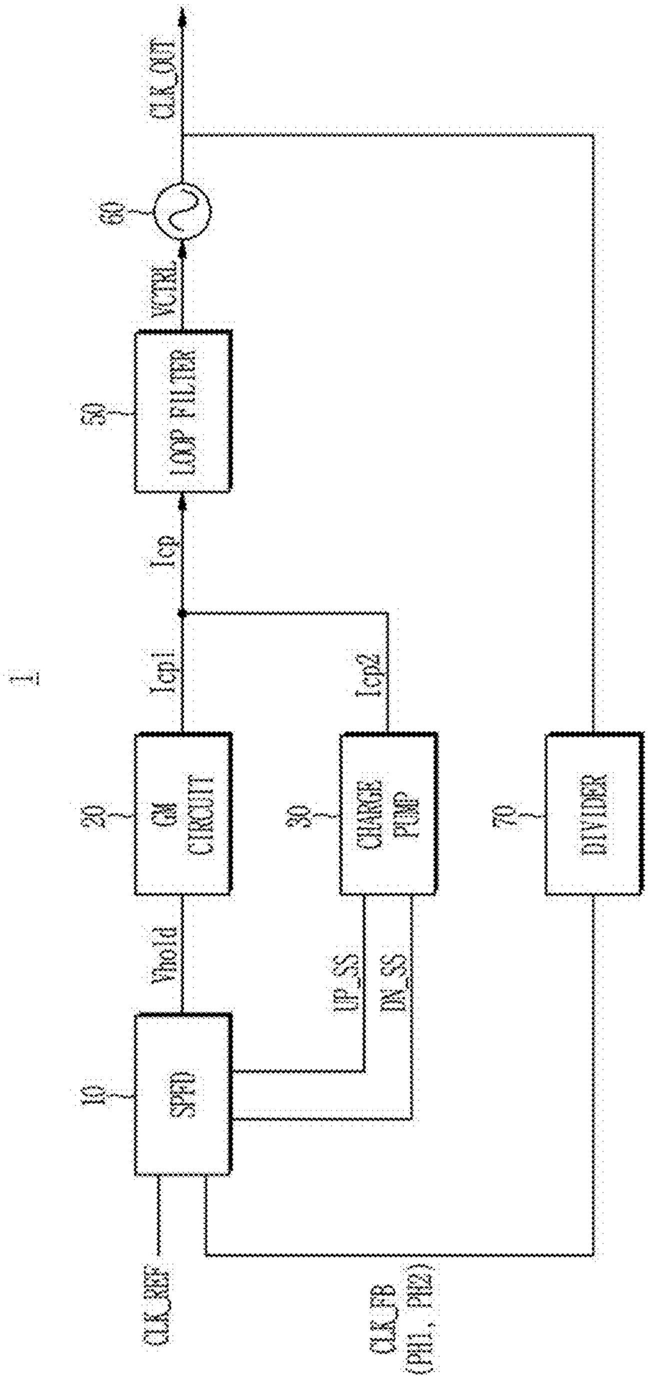
FIG. 1 is a block diagram showing a phase-locked loop device according to an embodiment.

Hereinafter, with reference to the attached drawings, various embodiments of the disclosure are described in detail so that those skilled in the art may easily implement the disclosure.

Embodiments of the disclosure may be implemented in many different forms, and are not limited to the embodiments described herein.

In order to clearly explain the disclosure, parts that are not relevant to the description are omitted, and identical or similar components are assigned the same reference numerals throughout the specification.

In addition, throughout the disclosure, when a part is said to "include" a certain component, this means that it may further include other components rather than excluding other components, unless specifically stated to the contrary.

Additionally, specific numbers described in a claim, even if explicitly recited within the claim, should not be construed as limiting the specific number in claims where such a citation does not exist.

For example, the phrases "at least one" and "one or more" may be included in subsequent dependent claims to aid understanding.

However, the use of such a phrase should not be understood as a limitation described by the unclear article "one" for the sake of one example.

Moreover, in cases where conventions such as "at least one of A, B, or C" are used, such phrases will be well understood by those familiar with this technical field (i.e., a "system that includes at least one of A, B, or C" includes the meaning of A alone, B alone, C alone, A and B, A and C, B and C, and/or A, B, and C together, but is not limited to any one concept).

Alternatively, letters and/or phrases in the description, claims, or drawings that have two or more separate selectable terms should be considered as likely to include one, either, or both terms.

For example, the phrase "A or B" should be understood to include the possibilities "A," "B," or "A and B."

FIG. 1 is a block diagram showing a phase-locked loop device according to an embodiment.

Referring to FIG. 1, the phase-locked loop device 1 may, in embodiments, be implemented as an integrated circuit manufactured by a semiconductor process, and in embodiments, at least one semiconductor package including the integrated circuit, and it may be included in a board on which a semiconductor package is mounted.

The phase-locked loop device 1 may be referred to as a phase-locked loop or a phase-locked loop circuit.

The phase-locked loop device 1 may output an output clock signal CLK_OUT based on a reference clock signal CLK_REF.

The reference clock signal CLK_REF may oscillate at a constant frequency and may be generated, for example, by a crystal oscillator.

The phase-locked loop device 1 may generate an output clock signal CLK_OUT having a target frequency used by a function block. For example, the function block may be included in a processor (not illustrated), and perform its own function, and operations of the function block may be controlled by the processor (not illustrated). In some embodiments, the function block may include a memory controller, a display controller, a graphic processing unit (GPU), an image signal processor, a multi format codec block, and the like.

The function block may process signals based on the output clock signal CLK_OUT, and the signal processing speed of the function block may depend on the frequency of the output clock signal CLK_OUT, while the jitter of the output clock signal CLK_OUT may limit the high-speed operation of the function block.

Accordingly, the phase-locked loop device 1 may generate an output clock signal CLK_OUT with reduced jitter by blocking the influence of noise causing jitter.

The phase-locked loop device 1 may include a sampling phase frequency detector 10 (illustrated as "SPFD"), a transconductance circuit 20 (illustrated as "GM CIRCUIT"), a charge pump 30, a loop filter 50, a voltage-controlled oscillator 60, and a divider 70.

The sampling phase frequency detector 10 may receive a reference clock signal CLK_REF from outside, for example from an outside of the phase-locked loop device 1.

The sampling phase frequency detector 10 may receive a first phase division signal and a second phase division signal PH2 from the divider 70.

The first and second phase division signals PH1 and PH2 may be referred to as a feedback signal CLK_FB.

In some embodiments, the first phase division signal PH1 may be a signal for sampling a specific voltage in the sampling phase frequency detector 10.

In some embodiments, the second phase division signal PH2 may be a signal for providing the voltage sampled by the sampling phase frequency detector 10 as a hold voltage Vhold.

A phase difference between the first and second phase division signals PH1 and PH2 may be constant.

In some embodiments, the sampling phase frequency detector 10 may detect the phase difference between the reference clock signal CLK_REF and the first phase division signal PH1, a hold voltage Vhold corresponding to the detected phase difference, and may generate a first status signal UP_SS and a second status signal DN_SS.

The hold voltage Vhold and the first and second status signals UP_SS and DN_SS may be examples of detection signals based on the phase difference output from the sampling phase frequency detector 10 according to an embodiment.

In embodiments, the sampling phase frequency detector 10 may sample the voltage generated by the reference clock signal CLK_REF at a specific node based on the first phase division signal PH1.

The sampled voltage may be referred to as a sampling voltage.

Figure 3:
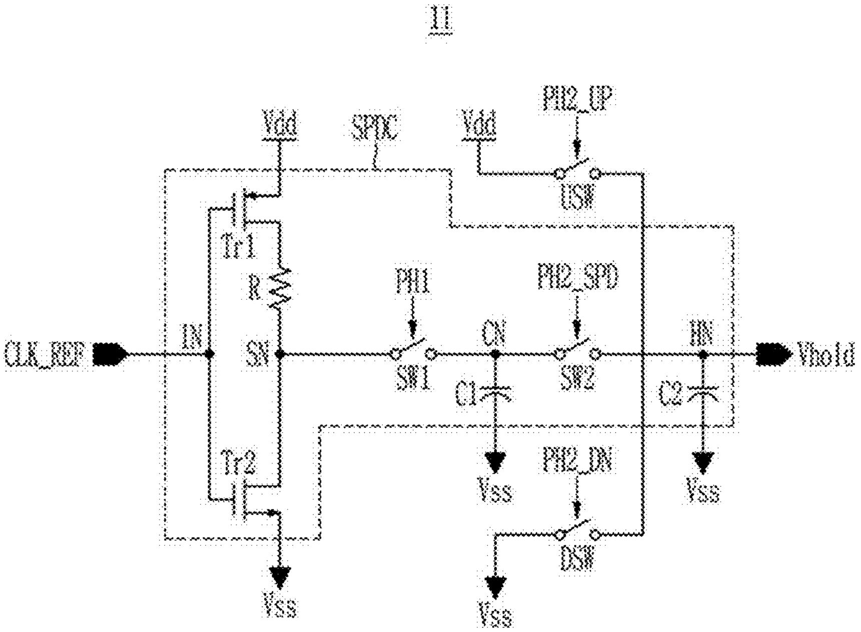
FIG. 3 is a circuit diagram showing a first circuit included in a sampling phase frequency detector according to embodiments.

In some embodiments, the sampling voltage may be sampled between a first supply voltage (e.g., Vdd shown in FIG. 3) and a second supply voltage (e.g., Vss shown in FIG. 3).

Based on the falling edge of the first phase division signal PH1, the sampling phase frequency detector 10 may sample the voltage between the first supply voltage and the second supply voltage.

The sampling phase frequency detector 10 may output one of the sampling voltage, the first supply voltage, and the second supply voltage as a detection signal based on the second phase division signal PH2.

In some embodiments, a voltage level of the second supply voltage may lower than a voltage level than the first supply voltage.

The second supply voltage may be, for example, ground, which may be a ground voltage.

The sampling phase frequency detector 10 may detect any one of the sampling voltage, the first supply voltage, and the second supply voltage according to the degree of the phase difference between the reference clock signal CLK_REF and the first phase division signal PH1, and may output the detected voltage as a detection signal.

For example, based on the phase difference between the reference clock signal CLK_REF and the first phase division signal PH1 being included in a first phase interval, which may be a specific phase interval, the sampling phase frequency detector 10 may output the sampling voltage as the detection signal.

Based on the phase difference between the reference clock signal CLK_REF and the first phase division signal PH1 being included in a second phase interval different from the first phase interval, the sampling phase frequency detector 10 may output the first supply voltage as the detection signal.

Based on the phase difference between the reference clock signal CLK_REF and the first phase division signal PH1 being included in a third phase interval, which is different from the first and second phase intervals, the sampling phase frequency detector 10 may output the second supply voltage as the detection signal.

In embodiments, the sampling phase frequency detector 10 may output the first and second status signals UP_SS and DN_SS according to the phase interval that includes the phase difference between the reference clock signal CLK_REF and the first phase division signal PH1.

In some embodiments, the sampling phase frequency detector 10 may operate based on the phase difference between the reference clock signal CLK_REF and a first inverted phase division signal PH1*b* in which the first phase division signal PH1 is inverted.

Based on the phase difference between the standard clock signal CLK_REF and the first inverted phase division signal PH1*b* being included in a predetermined phase interval, the sampling phase frequency detector 10 may not output the first and second status signals UP_SS and DN_SS.

Additionally, based on the phase difference being included in a phase interval other than the predetermined phase interval, the sampling phase frequency detector 10 may output the first and second status signals UP_SS and DN_SS.

In some embodiments, the first and second status signals UP_SS and DN_SS may be output in the form of pulse signals.

Pulse widths of the first and second status signals UP_SS and DN_SS may correspond to the phase difference between the reference clock signal CLK_REF and the first phase division signal PH1.

For example, as the phase difference between the first phase division signal PH1 and the reference clock signal CLK_REF increases, the pulse width of the first and second status signals UP_SS and DN_SS may also increase.

In some embodiments, the first status signal UP_SS may be referred to as an up selection signal, and the second status signal DN_SS may be referred to as a down selection signal.

Depending on lead and lag states between the reference clock signal CLK_REF and the first phase division signal PH1, one of the first and second status signals UP_SS and DN_SS may be output.

For example, based on determining that the first phase division signal PH1 leads the reference clock signal CLK_REF, the sampling phase frequency detector 10 may output the second status signal DN_SS in the form of a pulse signal, and while the second status signal DN_SS is output, the first status signal UP_SS may be maintained at a constant level.

As another example, based on determining that the first phase division signal PH1 lags behind the reference clock signal CLK_REF, the sampling phase frequency detector 10 may output the first status signal UP_SS in the form of a pulse signal, and while the first status signal UP_SS is output, the second status signal DN_SS may maintain a constant level.

The transconductance circuit 20 may convert the hold voltage Vhold into the first conversion current Icp1.

The transconductance circuit 20 may be referred to as a Gm circuit.

The transconductance circuit 20 may adjust the direction and magnitude of the first conversion current Icp1 according to the difference between the hold voltage and the reference voltage Vref.

A detailed description of an example of the transconductance circuit 20 is provided below in the description of FIG. 11.

The charge pump 30 may generate the second conversion current Icp2 based on the first and second status signals UP_SS and DN_SS.

In some embodiments, the charge pump 30 may source the current output from the current source as the second conversion current Icp2 to the output terminal based on the first and second status signals UP_SS and DN_SS, or the second conversion current Icp2 may be sinking from the terminal to the ground terminal.

In some embodiments, the charge pump 30 may adjust the direction and size of the second conversion current Icp2 according to the type and pulse width of the input status signals UP_SS and DN_SS.

In embodiments, the charge pump 30 may operate to input the second conversion current Icp2 into the loop filter 50 when the first status signal UP_SS is input. In embodiments, this may be referred to as the second conversion current Icp2 flowing in the forward or bidirectional (positive) direction.

Additionally, the charge pump 30 may operate to output the second conversion current Icp2 from the loop filter 50 when the second status signal DN_SS is input. In embodiments, this may refer to the direction in which the second conversion current Icp2 flows being reverse or negative direction.

In some embodiments, the charge pump 30 may output the second conversion current Icp2 according to the pulse width of the first and second status signals UP_SS and DN_SS.

As an example, the charge pump 30 receives the first status signal UP_SS, and as the pulse width of the provided first status signal UP_SS increases, the size of the output second conversion current Icp2 may also increase.

The pulse width of the first status signal UP_SS may correspond to the phase difference between the reference clock signal CLK_REF and the first phase division signal PH1, and the size of the second conversion current Icp2 may increase linearly as the pulse width of the first status signal UP_SS increases, in some embodiments.

As an example, the charge pump 30 may receive the second status signal DN_SS, and as the pulse width of the provided second status signal DN_SS increases, the size of the output second conversion current Icp2 may also increase.

The pulse width of the second status signal DN_SS may correspond to the phase difference between the reference clock signal CLK_REF and the first phase division signal PH1, and the size of the second conversion current Icp2 may increase linearly as the pulse width of the second status signal DN_SS increases, in some embodiments.

The loop filter 50 may generate a voltage control signal VCTRL based on the conversion current Icp, which may be the sum of the first conversion current Icp1 and the second conversion current Icp2, and may generate the voltage control signal VCTRL, so that it may be output to the voltage-controlled oscillator 60.

In embodiments, the loop filter 50 may be implemented as a low-pass filter, but embodiments are not limited thereto.

The voltage-controlled oscillator 60 may generate an output clock signal CLK_OUT based on the voltage control signal VCTRL.

The generated output clock signal CLK_OUT may be output to the outside of the phase-locked loop device 1, and may be provided to the divider 70.

In some embodiments, the voltage-controlled oscillator 60 may generate an output clock signal CLK_OUT having a frequency which is adjusted based on the voltage control signal VCTRL within a voltage variable range for the input voltage control signal VCTRL.

According to the frequency adjustment of the output clock signal CLK_OUT, the waveform and phase of the output clock signal CLK_OUT may be changed, and the waveform and phase of the divided first phase division signal PH1 may be changed accordingly.

In some embodiments, the voltage-controlled oscillator 60 may perform frequency adjustment on the output clock signal CLK_OUT until the output clock signal CLK_OUT is phase-locked.

The divider 70 may receive an output clock signal CLK_OUT.

The divider 70 may divide the output clock signal CLK_OUT into the first and second phase division signals PH1 and PH2.

In some embodiments, the first and second phase division signals PH1 and PH2 may be signals obtained by dividing the output clock signal CLK_OUT by M times (where M is a natural number greater than or equal to one ("1")) according to a desired division ratio.

In some embodiments, the sampling phase frequency detector 10, the transconductance circuit 20, the charge pump 30, the loop filter 50, the voltage-controlled oscillator 60, and the divider 70 may be referred to as a main loop.

The sampling phase frequency detector 10 may detect whether the main loop is locked or synchronized.

If the output clock signal CLK_OUT has a constant target frequency, the main loop may be referred to as fixed.

In some embodiments, when the phase of the first phase division signal PH1 based on the output clock signal CLK_OUT is leading or lagging the phase of the reference clock signal CLK_REF, fixing the main loop may cause the frequency and the phase of the output clock signal CLK_OUT to change.

The phase-locked loop device 1 according to embodiments may lock the phase and frequency using only the main loop, without using a separate frequency locking loop.

Accordingly, the degree of integration may be improved and the reliability and performance of the device may be increased.

Figure 2:
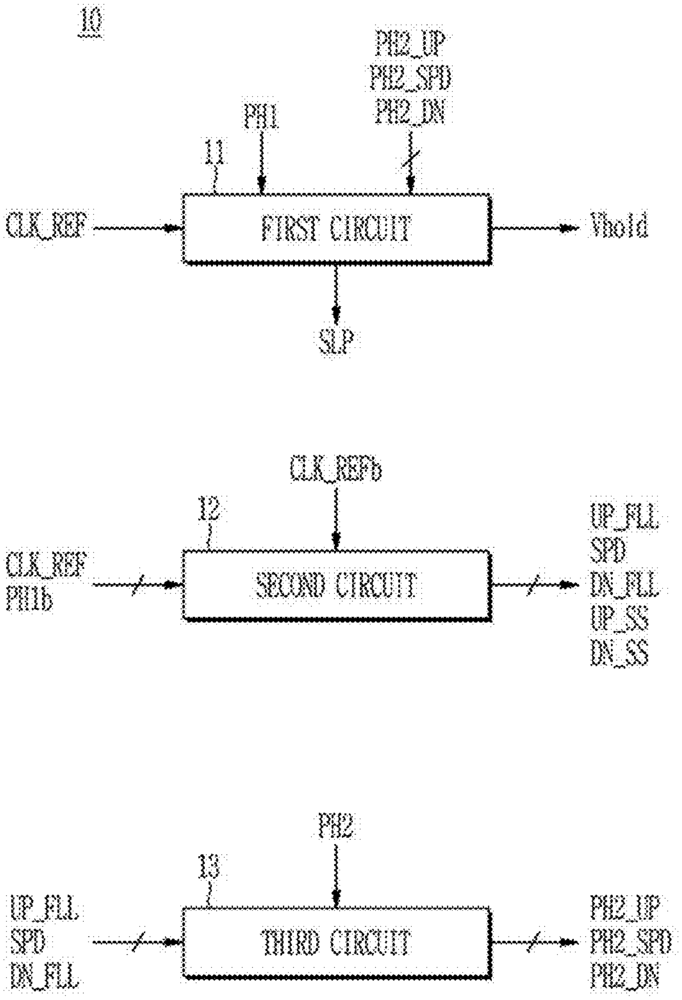
FIG. 2 is a block diagram showing a sampling phase frequency detector according to embodiments of the present disclosure.

FIG. 2 is a block diagram showing a sampling phase frequency detector according to embodiments.

Referring to FIG. 2, the sampling phase frequency detector 10 may include a first circuit 11, a second circuit 12, and a third circuit 13.

The first circuit 11 may receive a reference clock signal CLK_REF and a first phase division signal PH1.

The first circuit 210 may generate a sampling voltage by sampling the voltage in response to an edge of the first phase division signal PH1. In some embodiments, the phrase "in response to" may also mean, for example, "based on".

The sampling voltage may be a voltage generated at a specific node according to the reference clock signal CLK_REF and the first phase division signal PH1.

The first circuit 210 may receive the first switching signal PH2_UP, the second switching signal PH2_DN, and the third switching signal (\ PH2_SPD, and may output a hold voltage Vhold.

The first to third switching signals PH2_UP, PH2_DN, and PH2_SPD may be signals for selecting one of the first supply voltage, the second supply voltage, and the sampling voltage as the hold voltage Vhold.

For example, during a period when the first switching signal PH2_UP has the first logic level and the second and third switching signals PH2_DN and PH2_SPD have the second logic level, the first supply voltage may be output as the hold voltage Vhold.

Here, the first logic level may indicate logic high, and the second logic level may indicate logic low. However, embodiments not limited thereto.

As another example, during a period when the second switching signal PH2_DN has the first logic level and the first and third switching signals PH2_UP and PH2_SPD have the second logic level, the second supply voltage may be output as the hold voltage Vhold.

As yet another example, during a period when the third switching signal PH2_SPD has the first logic level and the first and second switching signals PH2_UP and PH2_DN have the second logic level, the sampling voltage may be output as the hold voltage Vhold.

Examples of the first to third switching signals PH2_UP, PH2_DN, and PH2_SPD) are described below with reference to FIGS. 6 to 10.

The second circuit 12 may receive the first inverted phase division signal PH1*b*, the reference clock signal CLK_REF, and the inverted reference clock signal CLK_REFb.

The first inverted phase division signal PH1*b* may be an inverted signal of the first phase division signal PH1. For example, the first inverted phase division signal PH1*b* may be an inversion of the first phase division signal PH1.

The inverted reference clock signal CLK_REFb may be an inverted signal of the reference clock signal CLK_REF. For example, the inverted reference clock signal CLK_REFb may be an inversion of the reference clock signal CLK_REF.

The second circuit 12 may output first selection signal UP_FLL, second selection signal DN_FLL, and third selection signal SPD to the third circuit 13.

Additionally, the second circuit 12 may output the first and second status signals UP_SS and DN_SS to the charge pump 30 of FIG. 1.

The first selection signal UP_FLL may be referred to as an up selection signal, the second selection signal DN_FLL may be referred to as a down selection signal, and the third selection signal SPD may be referred to as a sampling selection signal.

Examples of the first to third selection signals UP_FLL, DN_FLL, and SPD and the first and second status signals UP_SS and DN_SS are described below with reference to FIGS. 6 to 10.

The third circuit 13 may receive the first to third selection signals (UP_FLL, DN_FLL, SPD) and the second phase division signal PH2, and may output the first to third switching signals PH2_UP, PH2_DN, and PH2_SPD to the first circuit 11.

The first to third selection signals UP_FLL, DN_FLL, and SPD may be signals for matching the phase of one of the first to third switching signals PH2_UP, PH2_DN, and PH2_SPD to the phase of the second phase division signal PH2.

For example, if the first selection signal UP_FLL has the first logic level, and the second and third selection signals DN_FLL and SPD may have the second logic level, and the phase of the first switching signal PH2_UP may correspond to the phase of the second phase division signal PH2.

As another example, when the second selection signal DN_FLL has a first logic level and the first and third selection signals UP_FLL and SPD may have a second logic level, and the phase of the second switching signal PH2_DN correspond to the phase of the second phase division signal PH2.

As another example, when the third selection signal SPD_FLL has a first logic level and the first and second selection signals UP_FLL and DN_FLL may have a second logic level, the third switching signal PH2_SPD, the phase may correspond to the phase of the second phase division signal PH2.

The first switching signal PH2_UP may be referred to as an up switching signal, the second switching signal PH2_DN may be referred to as a down switching signal, and the third switching signal PH2_SPD may be referred to as a sampling switching signal.

Examples of the first to third switching signals PH2_UP, PH2_DN, and PH2_SPD are described below with reference to FIGS. 6 to 10.

FIG. 3 is a circuit diagram showing a first circuit included in a sampling phase frequency detector according to an embodiment.

Referring to FIGS. 1 to 3, the first circuit 11 may be implemented as an integrated circuit chip including an input terminal through which a reference clock signal CLK_REF is input and an output terminal through which a hold voltage Vhold is output.

The first circuit 11 may include a sampling phase detection circuit SPDC, an up switch USW, and a down switch DSW.

A sampling phase detection circuit SPDC may be placed between the input node IN and the hold node HN.

The sampling phase detection circuit SPDC may sample the voltage generated at the sampling node SN based on the first phase division signal PH1.

The voltage sampled at the sampling node SN may be referred to as a sampling voltage.

Additionally, the sampling phase detection circuit SPDC may transmit the sampling voltage as the hold voltage Vhold to the hold node HN based on the third switching signal PH2_SPD.

The sampling phase detection circuit SPDC may include a first transistor Tr1, a second transistor Tr2, a resistor R, a first switch SW1, a first capacitor C1, a second switch SW2, and a second capacitor C2.

The first transistor Tr1 may transmit the first supply voltage Vdd to the sampling node SN in response to the reference clock signal CLK_REF.

The first transistor Tr1 may be connected between a node to which the first supply voltage Vdd is applied and a sampling node SN to which a sampling voltage is generated.

For example, a first end of the first transistor Tr1 may be connected to the node to which the first supply voltage Vdd is applied, a second end of the first transistor Tr1 may be connected to the resistor R, and the gate terminal of the first transistor Tr1 may be connected to the input node IN where the reference clock signal CLK_REF is input.

When the first transistor Tr1 is turned on, the first supply voltage Vdd may be transmitted to the sampling node SN, and the level of the sampling voltage may increase. In embodiments, turning on a transistor may be referred to as activating the transistor, and turning off the transistor may be referred to as deactivating the transistor.

The second transistor Tr2 may transmit the second supply voltage Vss to the sampling node SN in response to the reference clock signal CLK_REF.

The second transistor Tr2 may be connected between the node to which the second supply voltage Vss is applied and the sampling node SN.

For example, a first end of the second transistor Tr2 may be connected to a node where the second supply voltage Vss is applied, a second end of the second transistor Tr2 may be connected to the sampling node SN, and the gate terminal of the second transistor Tr2 may be connected to the input node IN.

When the second transistor Tr2 is turned on, the second supply voltage Vss may be transmitted to the sampling node SN, and the level of the sampling voltage may be lowered.

In embodiments, the first transistor Tr1 may be implemented as a p-channel metal-oxide semiconductor (PMOS) transistor and the second transistor Tr2 may be implemented as an n-channel metal-oxide semiconductor (NMOS) transistor, but embodiments are not limited thereto.

In some embodiments, the first end of the first transistor Tr1 implemented as the PMOS transistor and the first end of the second transistor Tr2 implemented as the NMOS transistor may be referred to as sources.

The second end of the first transistor Tr1 and the second end of the second transistor Tr2 may be referred to as drains.

The resistor R may be connected between the second end of the first transistor Tr1 and the sampling node SN.

An edge slope may be formed in the sampling voltage by the resistance R when the first transistor Tr1 is turned on.

In some embodiments, when the sampling voltage increases, it may linearly increase from the second supply voltage Vss to the first supply voltage Vdd based on the edge slope.

The first switch SW1 may be connected between the sampling node SN and the charge node CN, and may connect the sampling node SN and the charge node CN in response to the first phase division signal PH1.

In embodiments, when the first phase division signal PH1 has a first logic level, the first switch SW1 may be turned on, and a sampling voltage may be applied to the charge node CN.

The first capacitor C1 may charge a charge corresponding to the difference between the voltage generated at the charge node CN and the second supply voltage Vss.

The first capacitor C1 may be connected between the node to which the second supply voltage Vss is applied and the charge node CN.

For example, a first end of the first capacitor C1 may be connected to the charge node CN, and a second end of the first capacitor C1 may be connected to a node to which the second supply voltage Vss is applied.

The second switch SW2 is connected between the charge node CN and the hold node HN, and may connect the charge node CN and the hold node HN in response to the third switching signal PH2_SPD.

In embodiments, if the third switching signal PH2_SPD has a first logic level, the second switch SW2 may be turned on, and the sampling voltage generated at the charge node CN (or the voltage corresponding to the charge charged in the first capacitor C1) may be applied to the hold node HN.

In embodiments, each of the first switch SW1 and the second switch SW2 may be implemented using an NMOS transistor, but embodiments are not limited thereto.

The second capacitor C2 may store a charge corresponding to a difference between the voltage (e.g., hold voltage Vhold) generated at the hold node HN and the second supply voltage Vss.

The second capacitor C2 may be connected between the node to which the second supply voltage Vss is applied and the hold node HN.

For example, a first end of the second capacitor C2 may be connected to the hold node HN, and a second end of the second capacitor C2 may be connected to a node to which the second supply voltage Vss is applied.

The up switch USW may transmit the first supply voltage Vdd as a hold voltage Vhold to the hold node HN based on the first switching signal PH2_UP.

The up switch USW may be connected between the node to which the first supply voltage Vdd is applied and the hold node HN, and may connect the node to which the first supply voltage Vdd is applied and the hold node HN in response to the first switching signal PH2_UP.

In embodiments, when the first switching signal PH_UP has a first logic level, the up switch USW may be turned on, and the first supply voltage Vdd may be applied to the hold node HN.

In embodiments, the up switch USW may be implemented using an NMOS transistor, but embodiments are not limited thereto.

The down switch DSW may transmit the second supply voltage Vss as a hold voltage Vhold to the hold node HN based on the second switching signal PH2_DN.

The down switch DSW may be connected between the node to which the second supply voltage Vss is applied and the hold node HN, and may connect the node to which the second supply voltage Vss is applied and the hold node HN in response to the second switching signal PH2_DN.

In embodiments, when the second switching signal PH_DN has a first logic level, the down switch DSW may be turned on, and the second supply voltage Vss may be applied to the hold node HN.

In embodiments, the down switch DSW may be implemented using an NMOS transistor, but embodiments are not limited thereto.

Figure 4:
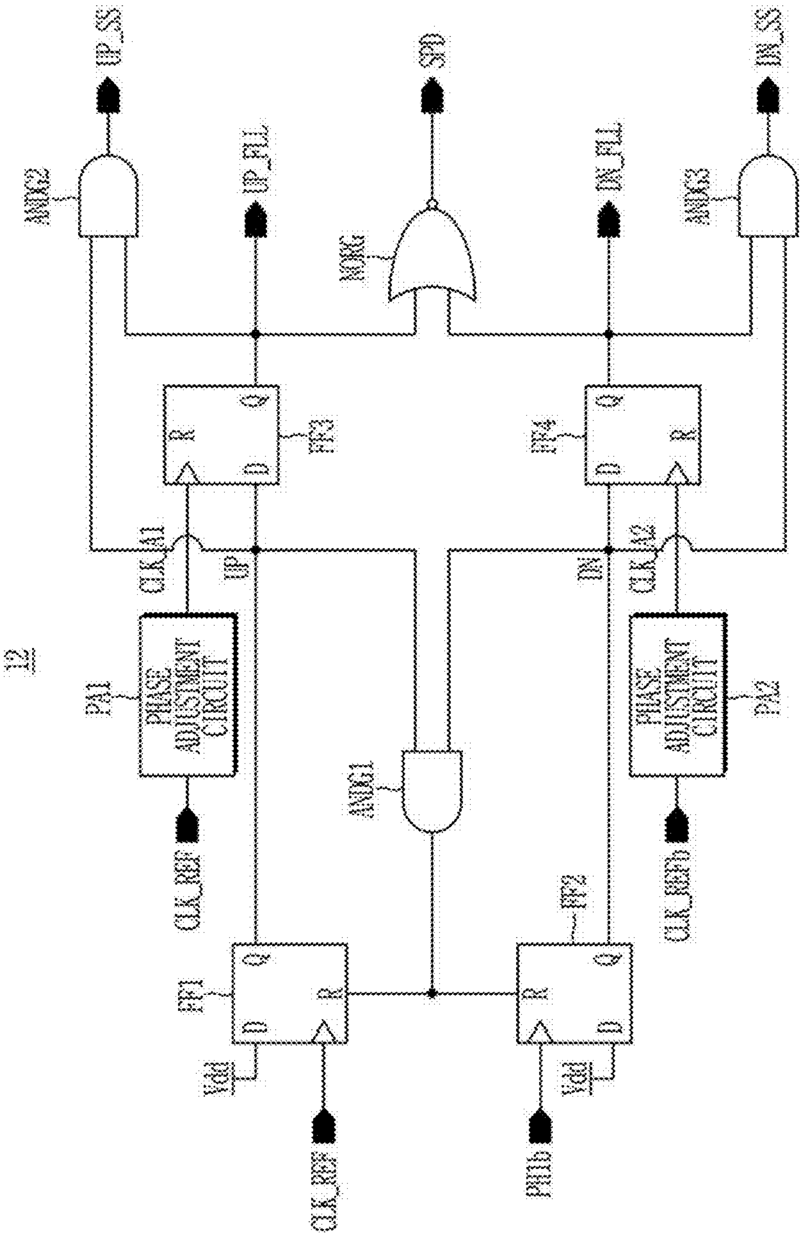
FIG. 4 is a circuit diagram showing a second circuit included in the sampling phase frequency detector according to embodiments.

FIG. 4 is a circuit diagram showing a second circuit included in the sampling phase frequency detector according to embodiments.

Referring to FIG. 1 through FIG. 4, the second circuit 12 may be implemented using an integrated circuit chip that includes an input terminal where the first inverted phase division signal PH1 is input, an input terminal where the reference clock signal CLK_REF is input, an input terminal where the inverted reference clock signal CLK_REFb is input, a terminal where the first to third selection signals UP_FLL, DN_FLL, and SPD are output, and a terminal where the first and second status signals UP_SS and DN_SS are output.

The second circuit 12 may include a first flip-flop FF1, a second flip-flip FF2, a third flip-flop FF3, a fourth flip-flop FF4, a first phase adjustment circuit PA1, a second phase adjustment circuit PA2, a first logical product gate ANDG1, a second logical product gate ANDG2, a third logical product gate ANDG3, and a negative OR gate NORG.

The first flip-flop FF1 may include a clock terminal to which the reference clock signal CLK_REF is input, an input terminal to which the first supply voltage Vdd is input, and an output terminal from which the first latch signal UP is output.

The first flip-flop FF1 may latch the first supply voltage Vdd in response to the reference clock signal CLK_REF and output the first latch signal UP.

In embodiments, the first flip-flop FF1 may output a first latch signal UP having a level of a first supply voltage Vdd (for example, a first logic level) in response to the rising edge of the reference clock signal CLK_REF.

The first latch signal UP may be referred to as an up latch signal.

The second flip-flop FF2 may include a clock terminal to which the first inverted phase division signal PH1*b* is input, an input terminal to which the first supply voltage Vdd is input, and an output terminal from which the second latch signal DN is output.

The second flip-flop FF2 may latch the first supply voltage Vdd in response to the first inverted phase division signal PH1*b* and output the second latch signal DN.

In embodiments, the second flip-flop FF2 may output a second latch signal DN having a level of the first supply voltage Vdd (for example, a first logic level) in response to a rising edge of the first inverted phase division signal PH1*b*.

The second latch signal DN may be referred to as a down latch signal.

The first logical product gate ANDG1 may have input terminals to which the first latch signal UP and the second latch signal DN are input, and an output terminal connected to reset terminals of each of the first flip-flop FF1 and the second flip-flop FF2.

The first ANDG1 may perform an AND operation on the first latch signal UP and the second latch signal DN.

In addition, the first logical product gate ANDG1 may transmit an output signal representing the result of the logical product operation as a reset signal to the reset terminals of each of the first flip-flop FF1 and the second flip-flop FF2.

In embodiments, when both the first latch signal UP and the second latch signal DN have a first logic level (e.g., logic high), the first logical product gate ANDG1 may output an output signal having a first logic level to the reset terminal of each of the first flip-flop FF1 and the second flip-flop FF2.

At this time, the first flip-flop FF1 and the second flip-flop FF2 may be reset.

The first phase-adjustment circuit PA1 may include an input terminal through which the reference clock signal CLK_REF is input, and an output terminal through which the first adjustment clock signal CLK_A1 is output.

The first phase-adjustment circuit PA1 may delay the output of the reference clock signal CLK_REF, change the phase of the reference clock signal CLK_REF, and output the first adjustment clock signal CLK_A1.

In some embodiments, the first phase-adjustment circuit PA1 may be an inverter chain including a plurality of inverters, but embodiments are not limited thereto.

In some embodiments, the first adjustment clock signal CLK_A1 may rise in synchronization with the timing at which the sampling phase frequency detector 10 samples the first supply voltage Vdd.

For example, the rising edge of the first inverted phase division signal PH1*b* may behind the rising edge of the reference clock signal CLK_REF by a first interval, so that the sampling phase frequency detector 10 detects a voltage at the level of the first supply voltage Vdd. When sampling, the first adjustment clock signal CLK_A1 may lag behind the reference clock signal CLK_REF in phase by the first interval.

The third flip-flop FF3 may include a clock terminal to which the first adjustment clock signal CLK_A1 is input, an input terminal to which the first latch signal UP is input, and an output terminal from which the first selection signal UP_FLL is output.

The third flip-flop FF3 may latch the first latch signal UP in response to the first adjustment clock signal CLK_A1 and output the latched signal as the first selection signal UP_FLL.

In embodiments, the third flip-flop FF3 may latch the first latch signal UP in response to the rising edge of the first adjustment clock signal CLK_A1.

The second logical product ANDG2 may include input terminals to which the first latch signal UP and the first selection signal UP_FLL are input, and an output terminal from which the first status signal UP_SS is output.

The second logical product gate ANDG2 may perform an AND operation on the first latch signal UP and the first selection signal UP_FLL.

Additionally, the second logical product gate ANDG2 may transmit the first status signal UP_SS indicating the result of the logical product operation to the charge pump 30.

The first status signal UP_SS may be output in the form of a pulse signal when the rising edge of the first inverted phase division signal PH1*b* lags behind the rising edge of the reference clock signal CLK_REF by a first predetermined interval.

In some embodiments, the pulse width of the first status signal UP_SS may correspond to the time interval between the rising edge of the first inverted phase division signal PH1*b* and the rising edge of the reference clock signal CLK_REF.

The second phase-adjustment circuit PA2 may include an input terminal to which the inverted reference clock signal CLK_REFb is input, and an output terminal from which the second adjustment clock signal CLK_A2 is output.

The second phase-adjustment circuit PA2 may delay the output of the inverted reference clock signal CLK_REFb, change the phase of the inverted reference clock signal CLK_REFb, and output it as the second adjustment clock signal CLK_A2.

In some embodiments, the second phase adjustment circuit PA2 may be an inverter chain including a plurality of inverters, but embodiments are not limited thereto.

In some embodiments, the second adjustment clock signal CLK_A2 may rise in synchronization with the timing at which the sampling phase frequency detector 10 samples the second supply voltage Vss.

For example, when the rising edge of the first inverted phase division signal PH1*b* precedes the rising edge of the reference clock signal CLK_REF by a second interval, the sampling phase frequency detector 10 may detect a voltage at the level of the second supply voltage Vss. When sampling, the second adjustment clock signal CLK_A2 may be ahead of the reference clock signal CLK_REF in phase by the second interval.

The fourth flip-flop FF4 may include a clock terminal to which the second adjustment clock signal CLK_A2 is input, an input terminal to which the second latch signal DN is input, and an output terminal from which the second selection signal DN_FLL is output.

The fourth flip-flop FF4 may latch the second latch signal DN in response to the second adjustment clock signal CLK_A2 and output the latched signal as the second selection signal DN_FLL.

In embodiments, the fourth flip-flop FF4 may latch the second latch signal DN in response to the rising edge of the second adjustment clock signal CLK_A2.

The third logical product gate ANDG3 may include input terminals to which the second latch signal DN and the second selection signal DN_FLL are input, and an output terminal from which the second status signal DN_SS is output.

The third logical product gate ANDG3 may perform an AND operation on the second latch signal DN and the second selection signal DN_FLL.

Additionally, the third logical product gate ANDG3 may transmit a second status signal DN_SS indicating the result of the ANDG operation to the charge pump 30.

The second status signal DN_SS may be output in the form of a pulse signal when the rising edge of the first inverted phase division signal PH1*b* is ahead of the rising edge of the reference clock signal CLK_REF by a second predetermined interval.

In some embodiments, the pulse width of the second status signal DN_SS may correspond to the time interval between the rising edge of the first inverted phase division signal PH1*b* and the rising edge of the reference clock signal CLK_REF.

The negative OR gate NORG may include input terminals to which the first selection signal UP_FLL and the second selection signal DN_FLL are input, and an output terminal from which the third selection signal SPD is output.

The negative OR gate NORG may perform a negative OR operation on the first selection signal UP_FLL and the second selection signal DN_FLL.

Additionally, the negative OR gate NORG may output an output signal representing the negative OR operation result as the third selection signal SPD.

In embodiments, when both the first selection signal UP_FLL and the second selection signal DN_FLL have a second logic level (e.g., logic low), the negative OR gate NORG may output a third selection signal SPD having the first logic level, and when one of the first selection signal UP_FLL and the second selection signal DN_FLL has the first logic level, a negative OR gate NORG may output the third selection signal SPD having the second logic level.

Figure 5:
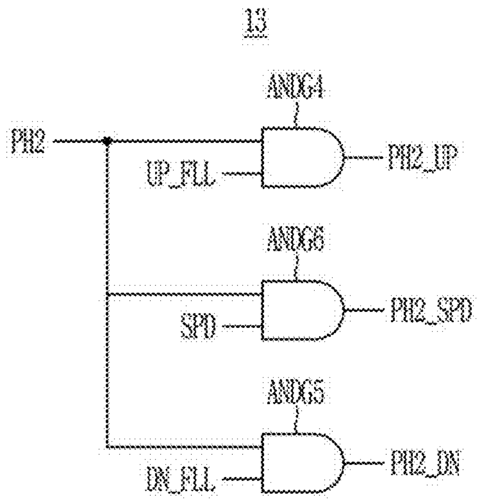
FIG. 5 is a circuit diagram showing a third circuit included in the sampling phase frequency detector according to embodiments.

FIG. 5 is a circuit diagram showing a third circuit included in the sampling phase frequency detector according to embodiments.

Referring to FIGS. 2 to 5, the third circuit 13 may include at least one input terminal to which the second phase division signal PH2 is input, and the first to third selection signals UP_FLL, DN_FLL, and SPD are input, and may be implemented as an integrated circuit chip including input terminals to which the first to third switching signals PH2_UP, PH2_DN, and PH2_SPD are output.

The third circuit 13 may include fourth logical product gate ANDG4, fifth logical product gate ANDG5, and sixth logical product gate ANDG6.

The fourth logical product gate ANDG4 may include input terminals to which the second phase division signal PH2 and the first selection signal UP_FLL are input, and an output terminal from which the first switching signal PH2_UP is output.

The fourth logical product gate ANDG4 may logically multiply the second phase division signal PH2 and the first selection signal UP_FLL to output the first switching signal PH2_UP.

In embodiments, when the first selection signal UP_FLL is at the first logic level, the fourth logical product gate ANDG4 may output the first switching signal PH2_UP equal to the second phase division signal PH2.

When the first selection signal UP_FLL is at the second logic level, the fourth logical product gate ANDG4 may output the first switching signal PH2_UP having the second logic level.

The fifth logical product ANDG5 may include input terminals to which the second phase division signal PH2 and the second selection signal DN_FLL are input, and an output terminal from which the second switching signal PH2_DN is output.

The fifth logical product gate ANDG5 may logically multiply the second phase division signal PH2 and the second selection signal DN_FLL to output a second switching signal PH2_DN.

In embodiments, when the second selection signal DN_FLL is at the first logic level, the fifth logical product gate ANDG5 may output a second switching signal PH2_DN equal to the second phase division signal PH2.

When the second selection signal DN_FLL is at the second logic level, the fifth logical product gate ANDG5 may output the second switching signal PH2_DN having the second logic level.

The sixth logical product gate ANDG6 may include input terminals to which the second phase division signal PH2 and the third selection signal SPD are input, and an output terminal from which the third switching signal PH2_SPD is output.

The sixth logical product gate ANDG6 may logically multiply the second phase division signal PH2 and the third selection signal SPD to output a third switching signal PH2_SPD.

In embodiments, when the third selection signal SPD is at the first logic level, the sixth logical product gate ANDG6 may output the third switching signal PH2_SPD equal to the second phase division signal PH2.

When the third selection signal SPD is at the second logic level, the sixth logical product gate ANDG6 may output the third switching signal PH2_SPD having the second logic level.

Figure 6:
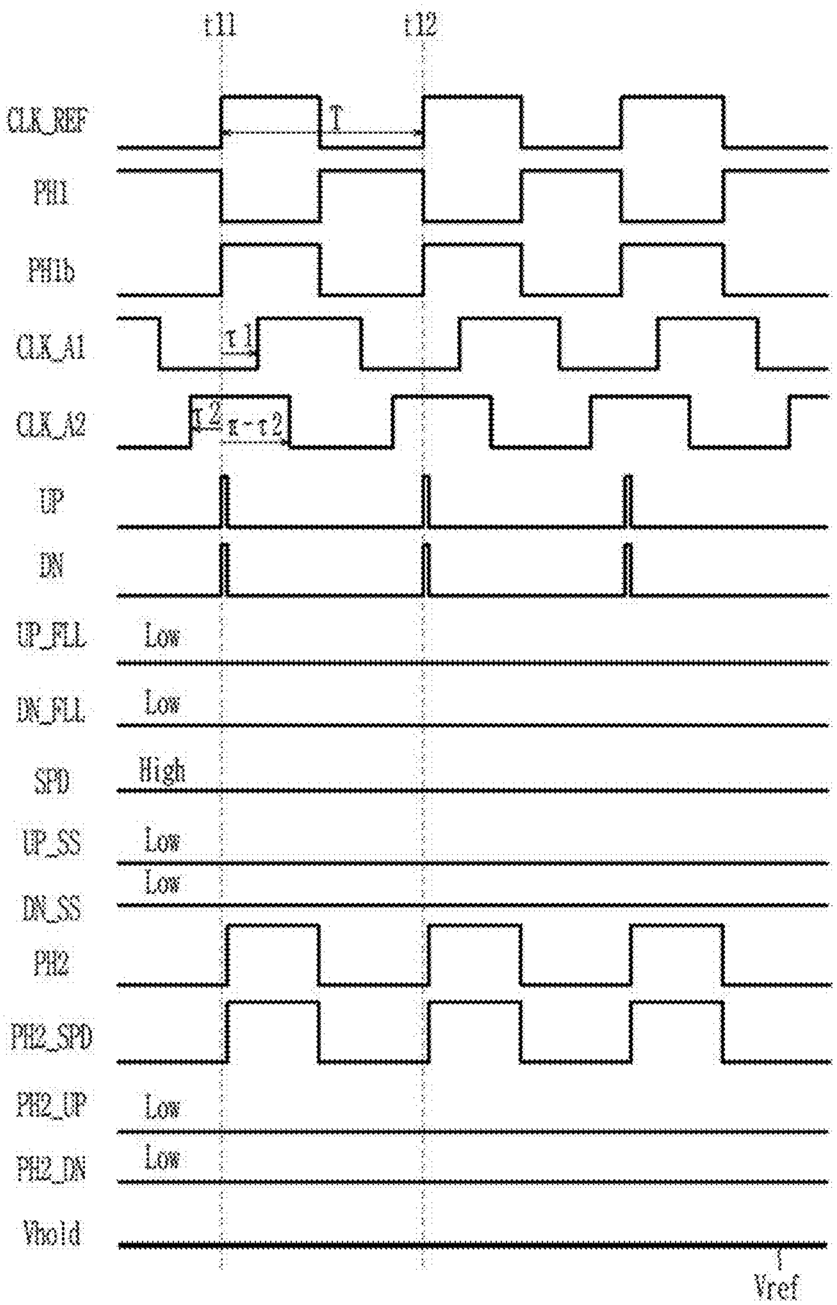
FIG. 6 is a timing diagram of signals occurring in a phase-lock state according to embodiments.

FIG. 6 is a timing diagram of signals occurring in a phase-lock state according to embodiments.

Referring to FIGS. 3 to 6, the level of the sampling voltage at the sampling node SN may be increased to reach the first supply voltage Vdd while the first transistor Tr1 is turned on.

Further, the level of the sampling voltage may be lowered to the second supply voltage Vss while the second transistor Tr2 is turned on.

In this way, the level of the sampling voltage may increase or decrease for each cycle of the reference clock signal CLK_REF.

The period of the reference clock signal CLK_REF may be, for example, 2π, but embodiments are not limited thereto.

The phase difference between the first and second phase division signals PH1 and PH2 shown in FIG. 6 may be constant, and may be the same as the phase difference between the first and second phase division signals PH1 and PH2 shown in FIGS. 7 to 10.

The period of each of the first and second phase division signals PH1 and PH2 shown in FIG. 6 may be the same as T, which may be the period of the reference clock signal CLK_REF.

At time t11, the first phase division signal PH1 may change from the first logic level to the second logic level, and the reference clock signal CLK_REF may change from the first logic level to the second logic level.

In embodiments, the first logic level may be logic high and the second logic level may be logic low.

In embodiments, a time at which the first logic level changes to the second logic level may be referred to as a falling edge, and a time at which the second logic level changes to the first logic level may be referred to as a rising edge.

The first phase-adjustment circuit PA1 may delay the reference clock signal CLK_REF by the first threshold time constant τ1, so that the first adjustment clock signal CLK_A1 may be greater than the first time point t11 by the first threshold time constant, and it may lag behind by τ1 and change from the second logic level to the first logic level.

The second phase adjustment circuit PA2 may delay the inverted reference clock signal CLK_REFb by TT-τ2 in response to the second threshold time constant τ2, so that the second adjustment clock signal CLK_A2 is delayed at the first time point t11, and it may be changed from the second logic level to the first logic level by the second threshold time constant τ2.

Because the first switch SW1 may be turned off in response to the falling edge of the first phase division signal PH1, the sampling voltage may be sampled at the falling edge of the first phase division signal PH1.

At this time, the level of the sampling voltage may correspond to the level of the reference voltage Vref, which may be for example, half of the first supply voltage Vdd (e.g., the reference voltage Vref may be Vdd/2).

Further, in response to the reference clock signal CLK_REF and the first inverted phase division signal PH1*b*, the first latch signal UP and the second latch signal DN may temporarily increase to the level of the first supply voltage Vdd. However, they may be reset by the output of the first logical product gate ANDG1 connected to the reset terminals of the first flip-flop FF1 and the second flip-flop FF2.

The reset levels of the first latch signal UP and the second latch signal DN may be a second logic level.

At this time, the first and second selection signals UP_FLL and DN_FLL may have a second logic level, and the first and second status signals UP_SS and DN_SS may have a second logic level.

Additionally, the third selection signal SPD may have the first logic level.

The first and second switching signals PH2_UP and PH2_DN may have a second logic level, and the third switching signal PH2_SPD may be equal to the second phase division signal PH2.

While the third switching signal PH2_SPD is at the first logic level, the sampling voltage applied to the charge node CN may be transmitted to the hold node HN as the hold voltage Vhold.

In the drawings, the pulse width of the reference clock signal CLK_REF and the pulse width of the first phase division signal PH1 are shown as being the same, but embodiments are not limited thereto. Further, the pulse width of the reference clock signal CLK_REF and the pulse width of the first phase division signal PH1 are shown as the same, but embodiments are not limited thereto, and in some embodiments the pulse widths of the first phase division signal PH1 may be different from the pulse width of the reference clock signal CLK_REF.

At time t12, the first phase division signal PH1 may change from the first logic level to the second logic level, and the reference clock signal CLK_REF may change from the first logic level to the second logic level.

The time point t12 may follow the time point t11 by a period T, which may the period of the reference clock signal CLK_REF.

At time t12, the sampling phase frequency detector 10 may operate in the same manner as at time t11.

As shown in FIG. 6, when the phase difference between the phase of the first inverted phase division signal PH1*b* and the phase of the reference clock signal CLK_REF is 0, sampling may be performed in response to the falling edge of the first phase division signal PH1, and the sampling voltage may be equal to the level of the reference voltage Vref.

For example, if the level of the sampling voltage corresponds to half the level of the first supply voltage Vdd at the falling edge when the first phase division signal PH1 changes from the first logic level to the second logic level, the third switching signal PH2_SPD may correspond to the second phase division signal PH2.

Accordingly, the level of the hold voltage Vhold may be the same as the level of the reference voltage Vref.

Figure 7:
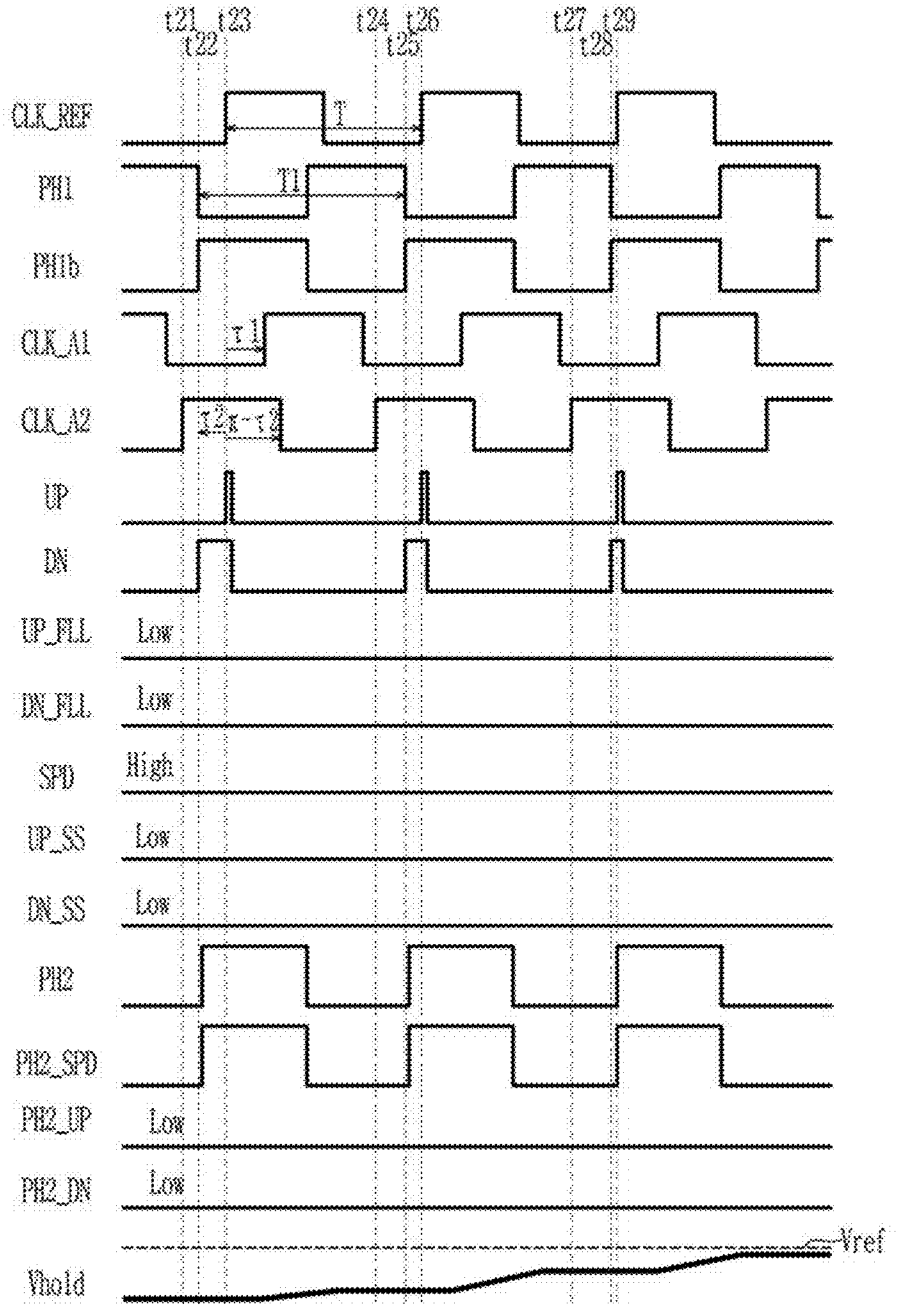
FIGS. 7 and 8 are timing diagrams of signals occurring in a phase-lead state according to embodiments.
Figure 8:
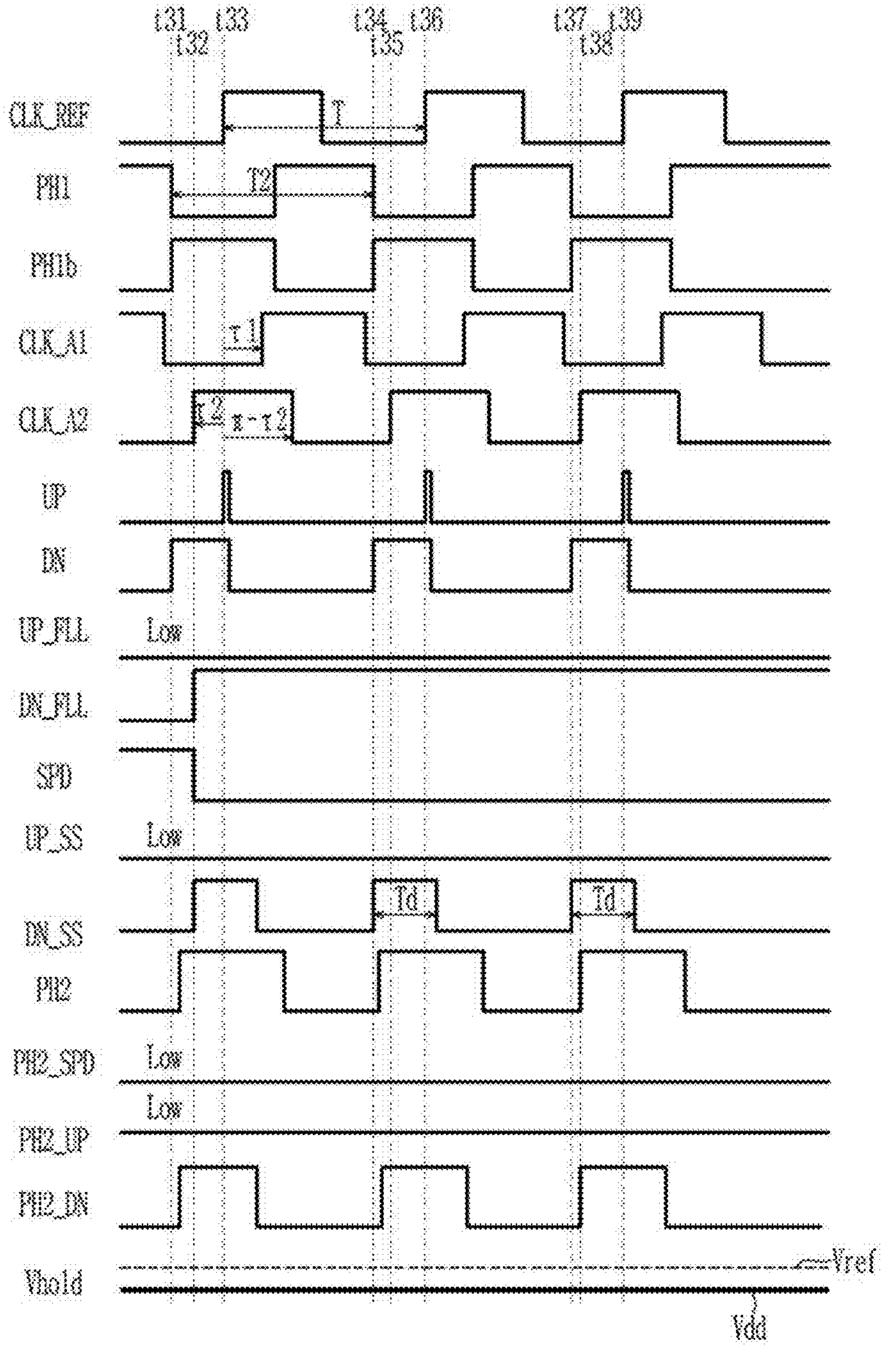

FIGS. 7 and 8 are timing diagrams of signals occurring in a phase lead state according to embodiments.

In some embodiments, the phase lead state may be determined based on the rising edge of the first inverted phase division signal PH1*b* and the rising edge of the reference clock signal CLK_REF.

Specifically, FIG. 7 is a timing diagram of signals that occur when the phase difference between the first inverted phase division signal PH1*b* and the reference clock signal CLK_REF is less than or equal to the second threshold time constant τ2, and FIG. 8 is a timing diagram of the first inverted phase division signal PH1*b* and the reference clock signal CLK_REF, which may be a timing diagram of signals that occur when the phase difference between the phase division signal PH1*b* and the reference clock signal CLK_REF is greater than the second threshold time constant τ2.

Referring to FIG. 1 to FIG. 5 and FIG. 7, when the phase of the first inverted phase division signal PH1*b* is relatively ahead of the phase of the reference clock signal CLK_REF, the falling edge of the first phase division signal PH1 the timing at which the sampling voltage is sampled may be relatively faster than the timing shown in FIG. 6.

For example, the period of each of the first and second phase division signals PH1 and PH2 shown in FIG. 7 may be a period T1, which may be smaller than the period T discussed above.

At time t21, the second adjustment clock signal CLK_A2 may change from the second logic level to the first logic level.

In response to the rising edge of the second adjustment clock signal CLK_A2, the second latch signal DN may be latched, so that the first and second selection signals UP_FLL and DN_FLL have a second logic level, and the third selection signal SPD may have a first logic level.

At time t22, the first inverted phase division signal PH1*b* may change from the second logic level to the first logic level.

In response to the rising edge of the first inverted phase division signal PH1*b*, the first supply voltage Vdd may be latched, and the second latch signal DN may have a first logic level.

At time t23, the reference clock signal CLK_REF may change from the second logic level to the first logic level.

In response to the rising edge of the reference clock signal CLK_REF, the first supply voltage Vdd may be latched, and the first latch signal UP may have a first logic level.

In response to the reference clock signal CLK_REF, the first latch signal UP may temporarily have the level of the first supply voltage Vdd, but may be reset by the output of the first logical product gate ANDG1 connected to the reset terminals of the first flip-flop FF1 and the second flip-flop FF2.

The reset levels of the first latch signal UP and the second latch signal DN may be a second logic level.

After time t23 and before time t24, which may be the rising edge of the second adjustment clock signal CLK_A2, the first adjustment clock signal CLK_A1 may change from the second logic level to the first logic level.

In response to the rising edge of the first adjustment clock signal CLK_A1, the first latch signal UP is latched, and the first and second selection signals UP_FLL and DN_FLL may have the second logic level, and the third selection signal SPD may have the first logic level.

At time t24, the second adjustment clock signal CLK_A2 may change from the second logic level to the first logic level.

In response to the rising edge of the second adjustment clock signal CLK_A2, the second latch signal DN may be latched, so that the first and second selection signals UP_FLL and DN_FLL have a second logic level, and the third selection signal SPD may have a first logic level.

At time t25, the first inverted phase division signal PH1*b* may change from the second logic level to the first logic level.

In response to the rising edge of the first inverted phase division signal PH1*b*, the first supply voltage Vdd may be latched, and the second latch signal DN may have a first logic level.

The period between time t22 and time t25 may be the period T1, which may be the period of the first inverted phase division signal PH1*b* at the interval of the rising edge of the first inverted phase division signal PH1*b*.

During the period between time t22 and time t25, the first and second selection signals UP_FLL and DN_FLL may have a second logic level, and the third selection signal SPD may have a first logic level.

The first and second switching signals PH2_UP and PH2_DN may have a second logic level, and the third switching signal PH2_SPD may be equal to the second phase division signal PH2.

While the third switching signal PH2_SPD is at the first logic level, the sampling voltage applied to the charge node CN may be transmitted to the hold node HN as the hold voltage Vhold.

At time t26, the reference clock signal CLK_REF may change from the second logic level to the first logic level.

In response to the rising edge of the reference clock signal CLK_REF, the first supply voltage Vdd may be latched, and the first latch signal UP may have a first logic level.

In response to the reference clock signal CLK_REF, the first latch signal UP may temporarily have the level of the first supply voltage Vdd, but may be reset by the output of the first logic product gate ANDG1 connected to the reset terminals of the first flip-flop FF1 and the second flip-flop FF2.

The reset levels of the first latch signal UP and the second latch signal DN may be a second logic level.

After time t26 and before time t27, which may be the rising edge of the second adjustment clock signal CLK_A2, the first adjustment clock signal CLK_A1 may change from the second logic level to the first logic level.

In response to the rising edge of the first adjustment clock signal CLK_A1, the first latch signal UP may be latched, so that the first and second selection signals UP_FLL and DN_FLL have a second logic level, and the third selection signal SPD may have a first logic level.

At time t27, the second adjustment clock signal CLK_A2 may change from the second logic level to the first logic level.

In response to the rising edge of the second adjustment clock signal CLK_A2, the second latch signal DN may be latched, so that the first and second selection signals UP_FLL and DN_FLL have a second logic level, and the third selection signal SPD may have a first logic level.

At time t28, the first inverted phase division signal PH1*b* may change from the second logic level to the first logic level.

In response to the rising edge of the first inverted phase division signal PH1*b*, the first supply voltage Vdd may be latched, and the second latch signal DN may have a first logic level.

At time t29, the reference clock signal CLK_REF may change from the second logic level to the first logic level.

In response to the rising edge of the reference clock signal CLK_REF, the first supply voltage Vdd may be latched, and the first latch signal UP may have a first logic level.

In response to the reference clock signal CLK_REF, the first latch signal UP may temporarily have the level of the first supply voltage Vdd, but may be reset by the output of the first logic product gate ANDG1 connected to the reset terminals of the first flip-flop FF1 and the second flip-flop FF2.

The reset levels of the first latch signal UP and the second latch signal DN may be a second logic level.

When the phase of the first inverted phase division signal PH1*b* is relatively ahead of the phase of the reference clock signal CLK_REF, the second latch signal may be generated according to the feedback operation of the main loop and repetition of the signal cycle in the phase-locked loop device 1, the length of the interval in which DN has the first logic level may decrease, and the phase difference between the first inverted phase division signal PH1*b* and the reference clock signal CLK_REF may also decrease.

In addition, according to the repetition of the signal cycle and the feedback operation of the main loop in the phase-locked loop device 1, the period of the output clock signal CLK_OUT may increase, and the period T1 of the first inverted phase division signal PH1*b* may be increased.

The hold voltage Vhold may be raised close to the reference voltage Vref.

In some embodiments, if the sampling phase-detection circuit SPDC performs a sampling operation at the rising edge of the second adjustment clock signal CLK_A2, the sampling voltage may be the second supply voltage Vss.

Referring to FIG. 8, the phase difference between the first inverted phase division signal PH1*b* and the reference clock signal CLK_REF may be greater than the second threshold time constant 2 of the reference clock signal CLK_REF.

For example, the period of each of the first and second phase division signals PH1 and PH2 shown in FIG. 8 may be the period T2, which may be smaller than the period T1 shown in FIG. 7.

At time t31, the first inverted phase division signal PH1*b* may change from the second logic level to the first logic level.

In response to the rising edge of the first inverted phase division signal PH1*b*, the first supply voltage Vdd may be latched, and the second latch signal DN may have a first logic level.

At time t32, the second adjustment clock signal CLK_A2 may change from the second logic level to the first logic level.

In response to the rising edge of the second adjustment clock signal CLK_A2, the second latch signal DN is latched, so that the second selection signal DN_FLL has a first logic level and the first and third selection signals UP_FLL, SPD may have a second logic level.

Additionally, the second status signal DN_SS may have a first logic level due to the second latch signal DN and the second selection signal DN_FLL.

At time t33, the reference clock signal CLK_REF may change from the second logic level to the first logic level.

In response to the rising edge of the reference clock signal CLK_REF, the first supply voltage Vdd may be latched, and the first latch signal UP may have a first logic level.

In response to the reference clock signal CLK_REF, the first latch signal UP may temporarily have the level of the first supply voltage Vdd, but may be reset by the output of the first logical product gate ANDG1 connected to the reset terminals of the first flip-flop FF1 and the second flip-flop FF2.

The reset levels of the first latch signal UP and the second latch signal DN may be a second logic level.

By resetting the second latch signal DN, the second status signal DN_SS may have a second logic level.

After time t33 and before time t34, which may be the rising edge of the first inverted phase division signal PH1*b*, the first adjustment clock signal CLK_A1 may change from the second logic level to the first logic level.

In response to the rising edge of the first adjustment clock signal CLK_A1, the first latch signal UP is latched, so that the first and third selection signals UP_FLL and SPD have a second logic level, and the second selection signal DN_FLL may have a first logic level.

At time t34, the first inverted phase division signal PH1*b* may change from the second logic level to the first logic level.

In response to the rising edge of the first inverted phase division signal PH1*b*, the first supply voltage Vdd may be latched, and the second latch signal DN may have a first logic level.

Additionally, due to the second latch signal DN and the second selection signal DN_FLL being latched at time t22, the second status signal DN_SS may have a first logic level.

The period between time t31 and time t34 may be the period T2, which may be the period of the first inverted phase division signal PH1*b* at the interval of the rising edge of the first inverted phase division signal PH1*b*.

During the period between time t31 and time t34, the first and third selection signals UP_FLL and SPD may have a second logic level, and the second selection signal DN_FLL may have a first logic level.

The first and third switching signals PH2_UP and PH2_SPD may have a second logic level, and the second switching signal PH2_DN may be equal to the second phase division signal PH2.

While the second switching signal PH2_DN is at the first logic level, the second supply voltage Vss may be transmitted as the hold voltage Vhold to the hold node HN.

At time t35, the second adjustment clock signal CLK_A2 may change from the second logic level to the first logic level.

In response to the rising edge of the second adjustment clock signal CLK_A2, the second latch signal DN may be latched, so that the second selection signal DN_FLL has a first logic level and the first and third selection signals UP_FLL, SPD may have a second logic level.

At time t36, the reference clock signal CLK_REF may change from the second logic level to the first logic level.

In response to the rising edge of the reference clock signal CLK_REF, the first supply voltage Vdd may be latched, and the first latch signal UP may have a first logic level.

In response to the reference clock signal CLK_REF, the first latch signal UP may temporarily have the level of the first supply voltage Vdd, but may be reset by the output of the first logical product gate ANDG1 connected to the reset terminals of the first flip-flop FF1 and the second flip-flop FF2.

The reset levels of the first latch signal UP and the second latch signal DN may be a second logic level.

By resetting the second latch signal DN, the second status signal DN_SS may have a second logic level.

After time t36 and before time t37, which may be the rising edge of the first inverted phase division signal PH1*b*, the first adjustment clock signal CLK_A1 may change from the second logic level to the first logic level.

In response to the rising edge of the first adjustment clock signal CLK_A1, the first latch signal UP may be latched, so that the first and third selection signals UP_FLL and SPD may have a second logic level, and the second selection signal DN_FLL may have a first logic level.

At time t37, the first inverted phase division signal PH1*b* may change from the second logic level to the first logic level.

In response to the rising edge of the first inverted phase division signal PH1*b*, the first supply voltage Vdd is latched, and the second latch signal DN may have a first logic level.

Additionally, due to the second latch signal DN and the second selection signal DN_FLL latched at time t22, the second status signal DN_SS may have a first logic level.

At time t38, the second adjustment clock signal CLK_A2 may change from the second logic level to the first logic level.

In response to the rising edge of the second adjustment clock signal CLK_A2, the second latch signal DN is latched, so that the second selection signal DN_FLL has a first logic level and the first and third selection signals UP_FLL, SPD may have a second logic level.

At time t39, the reference clock signal CLK_REF may change from the second logic level to the first logic level.

In response to the rising edge of the reference clock signal CLK_REF, the first supply voltage Vdd is latched, and the first latch signal UP may have a first logic level.

In response to the reference clock signal CLK_REF, the first latch signal UP may temporarily have the level of the first supply voltage Vdd, but it may be reset by the output of the first logic gate ANDG1 connected to the reset terminals of the first flip-flop FF1 and the second flip-flop FF2.

The reset levels of the first latch signal UP and the second latch signal DN may be a second logic level.

By resetting the second latch signal DN, the second status signal DN_SS may have a second logic level.

Similarly to FIG. 7, when the phase of the first inverted phase division signal PH1*b* is relatively ahead of the phase of the reference clock signal CLK_REF, based on the feedback operation of the main loop and the repetition of the signal cycle in the phase-locked loop device 1, the length of the interval in which the second latch signal DN has the first logic level may decrease, and the phase difference between the first inverted phase division signal PH1*b* and the reference clock signal CLK_REF may also decrease.

As the phase difference decreases, the second status interval Td, which may be the pulse width of the second status signal DN_SS, may also decrease.

In addition, according to the repetition of the signal cycle and the feedback operation of the main loop in the phase-locked loop device 1, the period of the output clock signal CLK_OUT may increase, and the period T2 of the first inverted phase division signal PH1*b* may be increase.

After the time t32, the second selection signal DN_FLL may have the first logic level and the first and third selection signals UP_FLL and SPD may have the second logic level, so the second supply voltage Vss may be delivered and maintained at the hold node HN as the hold voltage Vhold.

Figure 9:
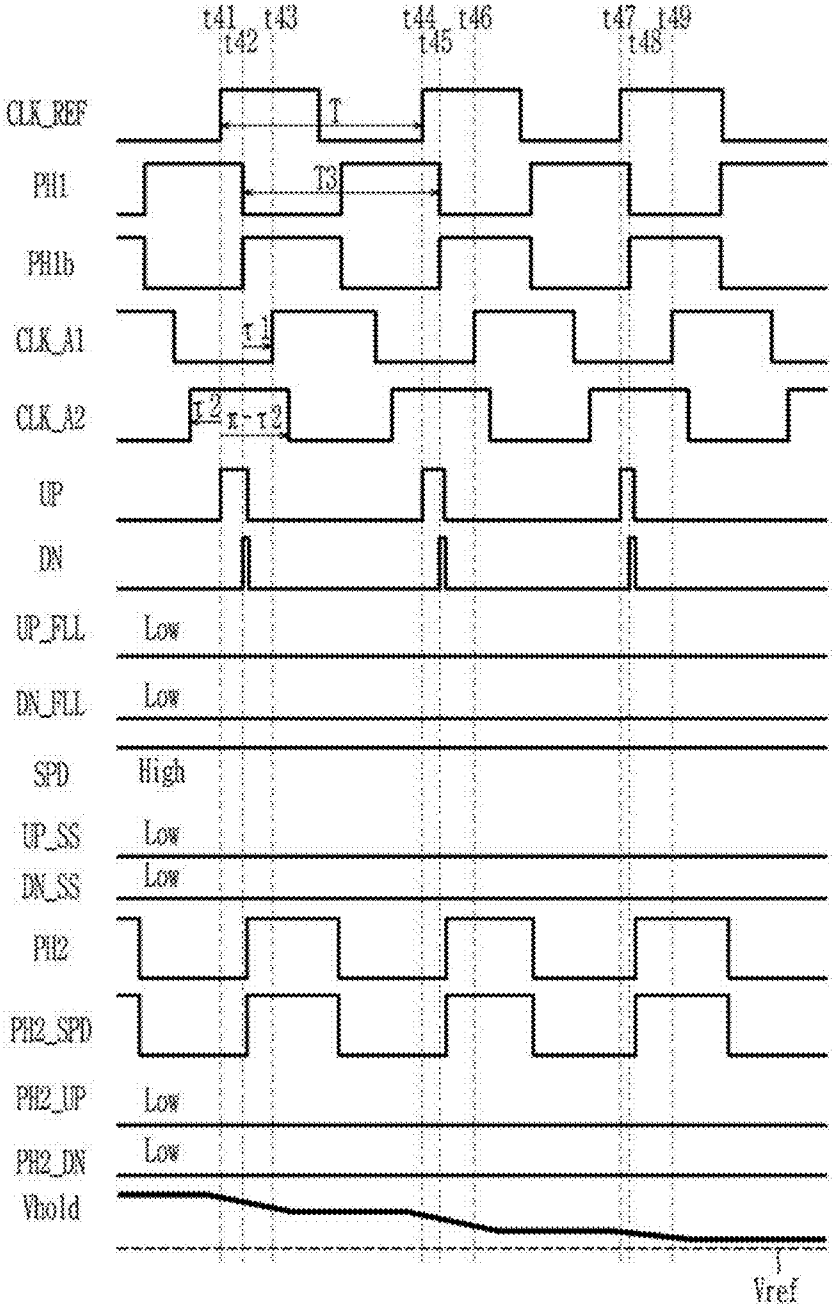
FIGS. 9 and 10 are timing diagrams of signals occurring in a phase-lag state according to embodiments.
Figure 10:
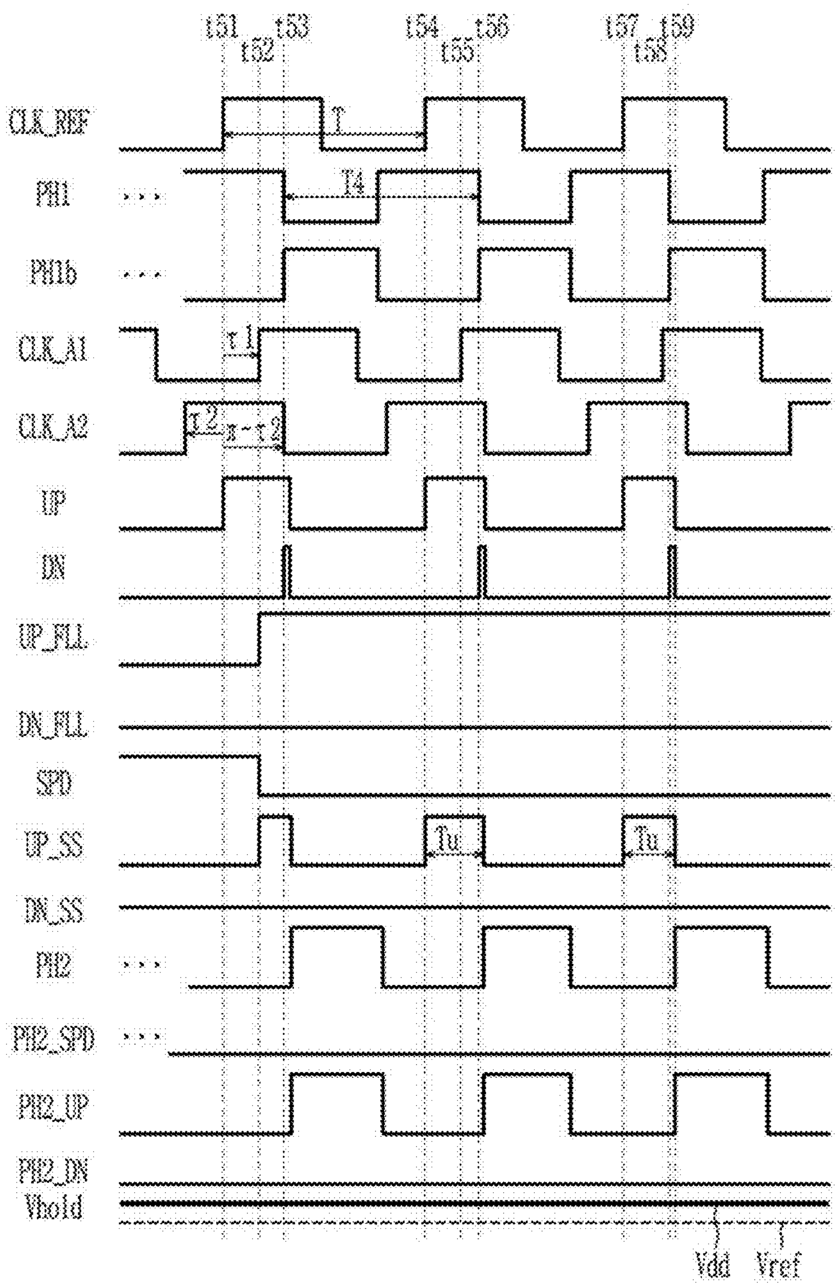

FIG. 9 and FIG. 10 are timing diagrams of signals occurring in a phase lag state according to embodiments.

In some embodiments, the phase lag state may be determined based on the rising edge of the first inverted phase division signal PH1*b* and the rising edge of the reference clock signal CLK_REF.

Specifically, FIG. 9 is a timing diagram of signals occurring when the phase difference between the first division signal PH1*b* and the reference clock signal CLK_REF is less than or equal to the first threshold time constant $\tau$1, and FIG. 10 is a timing diagram of signals occurring when the phase difference between the first inverted phase division signal PH1*b* and the reference clock signal CLK_REF is greater than the first threshold time constant $\tau$1.

Referring FIG. 1 to FIG. 5 and FIG. 9, when the phase of the first inverted phase division signal PH1*b* is relatively ahead of the phase of the reference clock signal CLK_REF, the timing at which the sampling voltage is sampled at the falling edge of the first phase division signal PH1 may be relatively delayed compared to the timing shown in FIG. 6.

For example, the period of each of the first and second phase division signals PH1 and PH2 shown in FIG. 9 may be the period T3, which may be greater than the period T discussed above.

At time t41, the reference clock signal CLK_REF may change from the second logic level to the first logic level.

In response to the rising edge of the reference clock signal CLK_REF, the first supply voltage Vdd may be latched, and the first latch signal UP may have a first logic level.

At time t42, the first inverted phase division signal PH1*b* may change from the second logic level to the first logic level.

In response to the rising edge of the first inverted phase division signal PH1*b*, the first supply voltage Vdd may be latched, and the second latch signal DN may have a first logic level.

In response to the first inverted phase division signal PH1*b*, the second latch signal DN may temporarily have the level of the first supply voltage Vdd, but may be reset by the output of the first logic product gate ANDG1 connected to the reset terminals of the first flip-flop FF1 and the second flip-flop FF2.

The reset levels of the first latch signal UP and the second latch signal DN may be a second logic level.

At time t43, the first adjustment clock signal CLK_A1 may change from the second logic level to the first logic level.

In response to the rising edge of the first adjustment clock signal CLK_A1, the first latch signal UP may be latched, so that the first and second selection signals UP_FLL and DN_FLL have a second logic level, and the third selection signal SPD may have a first logic level.

After time t43 and before time t24, which may be the rising edge of the reference clock signal CLK_REF, the second adjustment clock signal CLK_A2 may change from the second logic level to the first logic level.

In response to the rising edge of the second adjustment clock signal CLK_A2, the second latch signal DN may be latched, so that the first and second selection signals UP_FLL and DN_FLL have a second logic level, and the third selection signal SPD may have a first logic level.

At time t44, the reference clock signal CLK_REF may change from the second logic level to the first logic level.

In response to the rising edge of the reference clock signal CLK_REF, the first supply voltage Vdd is latched, and the first latch signal UP may have a first logic level.

At time t45, the first inverted phase division signal PH1*b* may change from the second logic level to the first logic level.

In response to the rising edge of the first inverted phase division signal PH1*b*, the first supply voltage Vdd may be latched, and the second latch signal DN may have a first logic level.

In response to the first inverted phase division signal PH1*b*, the second latch signal DN may temporarily have the level of the first supply voltage Vdd, but may be reset by the output of the first logic product gate ANDG1 connected to the reset terminals of the first flip-flop FF1 and the second flip-flop FF2.

The reset levels of the first latch signal UP and the second latch signal DN may be a second logic level.

The period between time t42 and time t45 may be T3, which may be the period of the first inverted phase division signal PH1*b* at the interval of the rising edge of the first inverted phase division signal PH1*b*.

During the period between time t42 and time t45, the first and second selection signals UP_FLL and DN_FLL may have second logic levels, and the third selection signal SPD may have a first logic level.

The first and second switching signals PH2_UP and PH2_DN may have a second logic level, and the third switching signal PH2_SPD may be equal to the second phase division signal PH2.

While the third switching signal PH2_SPD is at the first logic level, the sampling voltage applied to the charge node CN may be transmitted to the hold node HN as the hold voltage Vhold.

At time t46, the first adjustment clock signal CLK_A1 may change from the second logic level to the first logic level.

In response to the rising edge of the first adjustment clock signal CLK_A1, the first latch signal UP may be latched, so that the first and second selection signals UP_FLL and DN_FLL have a second logic level, and the third selection signal SPD may have a first logic level.

After time t46 and before time t27, which may be the rising edge of the reference clock signal CLK_REF, the second adjustment clock signal CLK_A2 may change from the second logic level to the first logic level.

In response to the rising edge of the second adjustment clock signal CLK_A2, the second latch signal DN may be latched, so that the first and second selection signals UP_FLL and DN_FLL have a second logic level, and the third selection signal SPD may have a first logic level.

At time t47, the reference clock signal CLK_REF may change from the second logic level to the first logic level.

In response to the rising edge of the reference clock signal CLK_REF, the first supply voltage Vdd may be latched, and the first latch signal UP may have a first logic level.

At time t48, the first inverted phase division signal PH1*b* may change from the second logic level to the first logic level.

In response to the rising edge of the first inverted phase division signal PH1*b*, the first supply voltage Vdd may be latched, and the second latch signal DN may have a first logic level.

In response to the first inverted phase division signal PH1*b*, the second latch signal DN may temporarily have the level of the first supply voltage Vdd, but may be offset by the output of the first logic product gate ANDG1 connected to the reset terminals of the first flip-flop FF1 and the second flip-flop FF2.

The reset levels of the first latch signal UP and the second latch signal DN may be a second logic level.

At time t49, the first adjustment clock signal CLK_A1 may change from the second logic level to the first logic level.

In response to the rising edge of the first adjustment clock signal CLK_A1, the first latch signal UP may be latched so that the first and second selection signals UP_FLL and DN_FLL have a second logic level, and the third selection signal SPD has a first logic level.

When the phase of the first inverted phase division signal PH1*b* lags relatively behind the phase of the reference clock signal CLK_REF, the first latch is the length of the interval in which the signal UP has the first logic level may decrease based on the feedback operation of the main loop in the phase-locked loop device 1 and the repetition of the signal cycle, and the phase difference between the first inverted phase division signal PH1*b* and the reference clock signal CLK_REF may also decrease.

In addition, according to the repetition of the signal cycle and the feedback operation of the main loop in the phase-locked loop device 1, the period of the output clock signal CLK_OUT may decrease, and the period T3 of the first inverted phase division signal PH1*b* may be reduced.

The hold voltage Vhold may be reduced to close to the reference voltage Vref.

In some embodiments, if the sampling phase detection circuit SPDC performs a sampling operation at the rising edge of the first adjustment clock signal CLK_A1, the sampling voltage may be the first supply voltage Vdd.

Referring to FIG. 10, the phase difference between the first inverted phase division signal PH1*b* and the reference clock signal CLK_REF may be greater than the second threshold time constant 12 of the reference clock signal CLK_REF.

For example, the period of each of the first and second phase division signals PH1 and PH2 shown in FIG. 10 may be the period T, which may be greater than T3 shown in FIG. 9.

At time t51, the reference clock signal CLK_REF may change from the second logic level to the first logic level.

In response to the rising edge of the reference clock signal CLK_REF, the first supply voltage Vdd is latched, and the first latch signal UP may have a first logic level.

At time t52, the first adjustment clock signal CLK_A1 may change from the second logic level to the first logic level.

In response to the rising edge of the first adjustment clock signal CLK_A1, the first latch signal UP may be latched, so that the first selection signal UP_FLL has a first logic level and the second and third selection signals DN_FLL, SPD may have a second logic level.

Additionally, the second status signal DN_SS may have a first logic level due to the second latch signal DN and the second selection signal DN_FLL.

At time t53, the first inverted phase division signal PH1*b* may change from the second logic level to the first logic level.

In response to the rising edge of the first inverted phase division signal PH1*b*, the first supply voltage Vdd may be latched, and the second latch signal DN may have a first logic level.

In response to the first inverted phase division signal PH1*b*, the second latch signal DN may temporarily have the level of the first supply voltage Vdd, but the first flip-flop FF1 and the second flip-flop FF2 may be reset by the output of the first logic product gate ANDG1 connected to the reset terminals of the first flip-flop FF1 and the second flip-flop FF2.

The reset levels of the first latch signal UP and the second latch signal DN may be a second logic level.

By resetting the first latch signal UP, the first status signal UP_SS may have a second logic level.

After time t53 and before time t54, which is the rising edge of the reference clock signal CLK_REF, the second adjustment clock signal CLK_A2 may change from the second logic level to the first logic level.

In response to the rising edge of the second adjustment clock signal CLK_A2, the second latch signal DN may be latched, so that the second and third selection signals DN_FLL and SPD have a second logic level and the first selection signal UP_FLL may have a first logic level.

At time t54, the reference clock signal CLK_REF may change from the second logic level to the first logic level.

In response to the rising edge of the reference clock signal CLK_REF, the first supply voltage Vdd may be latched, and the first latch signal UP may have a first logic level.

Additionally, due to the first latch signal UP and the first selection signal UP_FLL latched at time t52, the first status signal UP_SS may have a first logic level.

At time t55, the first adjustment clock signal CLK_A1 may change from the second logic level to the first logic level.

In response to the rising edge of the first adjustment clock signal CLK_A1, the first latch signal UP may be latched, so that the first selection signal UP_FLL has a first logic level and the second and third selection signals DN_FLL, SPD may have a second logic level.

At time t56, the first inverted phase division signal PH1*b* may change from the second logic level to the first logic level.

In response to the rising edge of the first inverted phase division signal PH1*b*, the first supply voltage Vdd may be latched, and the second latch signal DN may have a first logic level.

In response to the first inverted phase division signal PH1*b*, the second latch signal DN may temporarily have the level of the first supply voltage Vdd, but it may be reset by the output of the first logical product gate ANDG1 connected to the reset terminals of the first flip-flop FF1 and the second flip-flop FF2.

The reset levels of the first latch signal UP and the second latch signal DN may be a second logic level.

By resetting the first latch signal UP, the first status signal UP_SS may have a second logic level.

The period between time t53 and time t56 may be the period T4, which may be the period of the first inverted phase division signal PH1*b* at the interval of the rising edge of the first inverted phase division signal PH1*b*.

During the period between time t53 and time t56, the second and third selection signals DN_FLL and SPD may have a second logic level, and the first selection signal UP_FLL may have a first logic level.

The second and third switching signals PH2_DN and PH2_SPD may have a second logic level, and the first switching signal PH2_UP may be equal to the second phase division signal PH2.

While the first switching signal PH2_UP is at the first logic level, the first supply voltage Vdd may be transmitted as the hold voltage Vhold to the hold node HN.

After time t56 and before time t57, which is the rising edge of the first inverted phase division signal PH1*b*, the second adjustment clock signal CLK_A2 may change from the second logic level to the first logic level.

In response to the rising edge of the second adjustment clock signal CLK_A2, the second latch signal DN may be latched, so that the second and third selection signals DN_FLL and SPD have a second logic level and the first selection signal UP_FLL may have a first logic level.

At time t57, the reference clock signal CLK_REF may change from the second logic level to the first logic level.

In response to the rising edge of the reference clock signal CLK_REF, the first supply voltage Vdd may be latched, and the first latch signal UP may have a first logic level.

Additionally, due to the first latch signal UP and the first selection signal UP_FLL being latched at time t52, the first status signal UP_SS may have a first logic level.

At time t58, the first adjustment clock signal CLK_A1 may change from the second logic level to the first logic level.

In response to the rising edge of the first adjustment clock signal CLK_A1, the first latch signal UP may be latched, so that the first selection signal UP_FLL has a first logic level and the second and third selection signals DN_FLL, SPD may have a second logic level.

At time t59, the first inverted phase division signal PH1*b* may change from the second logic level to the first logic level.

In response to the rising edge of the first inverted phase division signal PH1*b*, the first supply voltage Vdd may be latched, and the second latch signal DN may have a first logic level.

In response to the first inverted phase division signal PH1*b*, the second latch signal DN may temporarily have the level of the first supply voltage Vdd, but the first flip-flop FF1 and the second flip-flop may be reset by the output of the first logical product gate ANDG1 connected to the reset terminal of FF2.

The reset levels of the first latch signal UP and the second latch signal DN may be a second logic level.

By resetting the first latch signal UP, the first status signal UP_SS may have a second logic level.

As shown in FIG. 9, when the phase of the first inverted phase distribution signal PH1*b* lags relatively behind the phase of the reference clock signal CLK_REF, the length of the interval in which the first latch signal UP has the first logic level may decrease due to the feedback operation of the main loop in the phase-locked loop device 1 and the repetition of the signal cycle, and the phase difference between the first inverted phase distribution signal PH1*b* and the reference clock signal CLK_REF may also decrease.

As the phase difference decreases, the first status interval Tu, which may be the pulse width of the first status signal UP_SS, may also decrease.

In addition, according to the repetition of the signal cycle and the feedback operation of the main loop in the phase-locked loop device 1, the period of the output clock signal CLK_OUT may decrease, and the period T4 of the first inverted phase division signal PH1*b* may decrease.

After t52, the first selection signal UP_FLL has a first logic level and the second and third selection signals DN_FLL and SPD may have a second logic level, so that the first supply voltage Vdd is a hold voltage and may be transmitted to and maintained in the hold node HN as Vhold.

As shown in FIGS. 6 to 10, the level of any one of the first to third selection signals UP_FLL, DN_FLL, and SPD may be the first logic level, and the levels of the remaining selection signals may be the second logic level.

And among the first to third switching signals PH2_UP, PH2_DN, and PH2_SPD, the switching signal corresponding to the selection signal having the first logic level may correspond to the second phase division signal.

As shown in FIGS. 8 and 10, even if the phase of the first inverted phase division signal PH1*b* is excessively ahead or behind the phase of the reference clock signal CLK_REF, it may not be affected by the sampling voltage.

If the phase difference between the first reverse phase division signal PH1*b* and the reference clock signal CLK_REF exceeds a predetermined interval, the first supply voltage Vdd or the second supply voltage Vss may be provided as the hold voltage Vhold, and through the first and second status signals UP_SS and DN_SS corresponding to the phase difference, it may be possible to easily track the phase and frequency of the output clock signal CLK_OUT.

Later, during feedback control performed by the transconductance circuit 20, charge pump 30, and loop filter 50, the frequency of the output clock signal CLK_OUT may be tracked, thereby controlling the frequency of the output clock signal CLK_OUT, so embodiments may have the advantage of being able to set the frequency to the target frequency.

Figure 11:
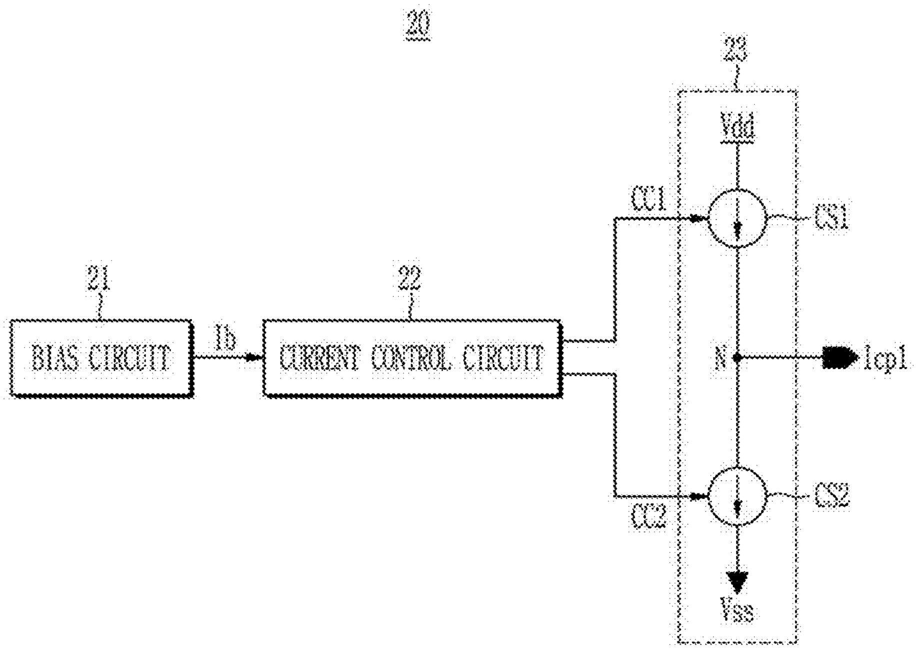
FIG. 11 is a diagram showing a transconductance circuit according to embodiments.

FIG. 11 is a diagram showing a transconductance circuit according to embodiments.

Referring to FIGS. 1 and 11, the transconductance circuit 20 may include a bias circuit 21, a current control circuit 22, and a current-providing circuit 23.

The bias circuit 21 may provide a constant bias current (lb) to the current control circuit 22.

FIG. 11 shows an example in which the number of bias circuits 21 is one, but embodiments are not limited thereto. For example, in order to increase the magnitude of the bias current Ib, a plurality of bias circuits 21 may be included in the transconductance circuit 20 in some embodiments.

The current control circuit 22 may compare the magnitude of the hold voltage Vhold and the magnitude of the reference voltage Vref.

The reference voltage Vref may be, for example, half of the first supply voltage Vdd (e.g., the reference voltage may be Vdd/2), but embodiments are not limited thereto.

In some embodiments, the reference voltage Vref may be generated within the current control circuit 22.

In other embodiments, the current control circuit 22 may receive a reference voltage Vref from an external source.

The current control circuit 22 may control the current-providing circuit 23 to adjust the first conversion current Icp1 output from the current-providing circuit 23, depending on the result of comparing the magnitude of the hold voltage Vhold with the magnitude of the reference voltage Vref.

For example, if the magnitude (or level) of the hold voltage Vhold is the same as the magnitude of the reference voltage Vref (e.g., if the hold voltage Vhold is phase-locked with the reference voltage Vref), the current control circuit 22 may control the current-providing circuit 23 so that the first conversion current Icp1 is not output.

As another example, when the magnitude (or level) of the hold voltage Vhold is smaller than the magnitude of the reference voltage Vref (i.e., e.g., when the phase of the voltage Vhold leads the phase of the reference voltage Vref), the current control circuit 22 may control the first conversion current Icp1 to output from the loop filter 50 (which may be referred to as the direction in which the first conversion current Icp1 flows being in the reverse or negative direction).

As yet another example, when the magnitude (or level) of the hold voltage Vhold is larger than the magnitude of the reference voltage Vref (e.g., when the phase of the voltage Vhold lags the phase of the reference voltage Vref), the current control circuit 22 may control the current-providing circuit 23 so that the first conversion current Icp1 is input to the loop filter 50 (this may be referred to as the first conversion current Icp1 flowing in the positive or bidirectional direction).

In embodiments, the number of current control circuits 22 may be one, but embodiments are not limited thereto, and in another embodiment, a plurality of current control circuits 22 may be included in the transconductance circuit 20.

The current control circuit 22 may include a first current source CS1 and a second current source CS2.

The first current source CS1 may be connected between the first supply voltage Vdd and the supplied line and the node N.

The first current source CS1 may provide a first current (or up current) to the node N.

The first current may flow from the line supplied with the first supply voltage Vdd to the node N.

The second current source CS2 may be connected between the second supply voltage Vss and the supplied line and the node N.

The second current source CS2 may provide a second current (or down current) from the node N to the line supplied with the second supply voltage Vss.

As shown in FIG. 11, according to Kirchhoff's current law, the first current of the first current source CS1, the second current of the second current source CS2, and the first conversion current Icp1 at the node N may be 0.

In embodiments, the current control circuit 22 may provide the first current control signal CC1 and the second current control signal CC2 to the first current source CS1 and the second current source CS2, respectively, based on a result of a comparison between the magnitudes of the hold voltage Vhold and the reference voltage Vref.

The first current control signal CC1 and the second current control signal CC2 may be signals for controlling the current generated by each of the first and second current sources CS1 and CS2.

In some embodiments, the first current control signal CC1 and the second current control signal CC2 may be signals indicating the magnitude of the current generated by each of the first current source CS1 and the second current source CS2.

The sum of the current magnitude according to the first current control signal CC1 and the current magnitude according to the second current control signal CC2 is made to correspond to the bias current Ib, and if the current magnitude according to the first current control signal CC1 increases, the current magnitude according to the second current control signal CC2 may decrease, or if the current magnitude according to the first current control signal CC1 decreases, the current magnitude according to the second current control signal CC2 may increase.

For example, when the bias current Ib is 400 μA, the sum of the current size according to the first current control signal CC1 and the current size according to the second current control signal CC2 is 400 μA, the amount of change in current according to the first current control signal CC1 and the amount of change in current according to the second current control signal CC2 may be opposite to each other. However, embodiments are not limited thereto.

In example described above, the bias current Ib may be, for example, 400 μA, but embodiments are not limited thereto.

If the magnitude of the hold voltage Vhold is the same as the magnitude of the reference voltage Vref, the current control circuit 22 may output the first and second current control signals CC1 and CC2 so that the first and second currents are both 200 μA.

At this time, the first conversion current Icp1 may be 0 A.

In embodiments, when the magnitude of the hold voltage Vhold is greater than the magnitude of the reference voltage Vref, the current control circuit 22 applies the first current control signal CC1 to the first current source CS1 so that the first current has a value greater than 200 μA, and the second current control signal CC2 may be output to the second current source CS2 so that the second current has a value less than 200 μA.

At this time, the first conversion current Icp1 may flow from the node N to the input terminal of the loop filter 50 according to Kirchhoff's current law.

Meanwhile, when the magnitude of the hold voltage Vhold is smaller than the magnitude of the reference voltage Vref, the current control circuit 22 may send the first current control signal CC1 to the first current source CS1 so that the first current has a value less than 200 Ma, and the second current control signal CC2 may be output to the second current source CS2 such that the second current has a value greater than 200 μA.

At this time, the first conversion current Icp1 may flow from the input terminal of the loop filter 50 to the node N according to Kirchhoff's current law.

When the first conversion current Icp1 flows from the node N to the input terminal of the loop filter 50, the loop filter 50 may increase the magnitude of the voltage control signal VCTRL.

When the increased voltage control signal VCTRL is input to the voltage-controlled oscillator 60, the phase of the output clock signal CLK_OUT may become faster.

When the first conversion current Icp1 flows from the input terminal of the loop filter 50 to the node N, the loop filter 50 may reduce the magnitude of the voltage control signal VCTRL.

When the reduced voltage control signal VCTRL is input to the voltage-controlled oscillator 60, the phase of the output clock signal CLK_OUT may be slowed.

Figure 12:
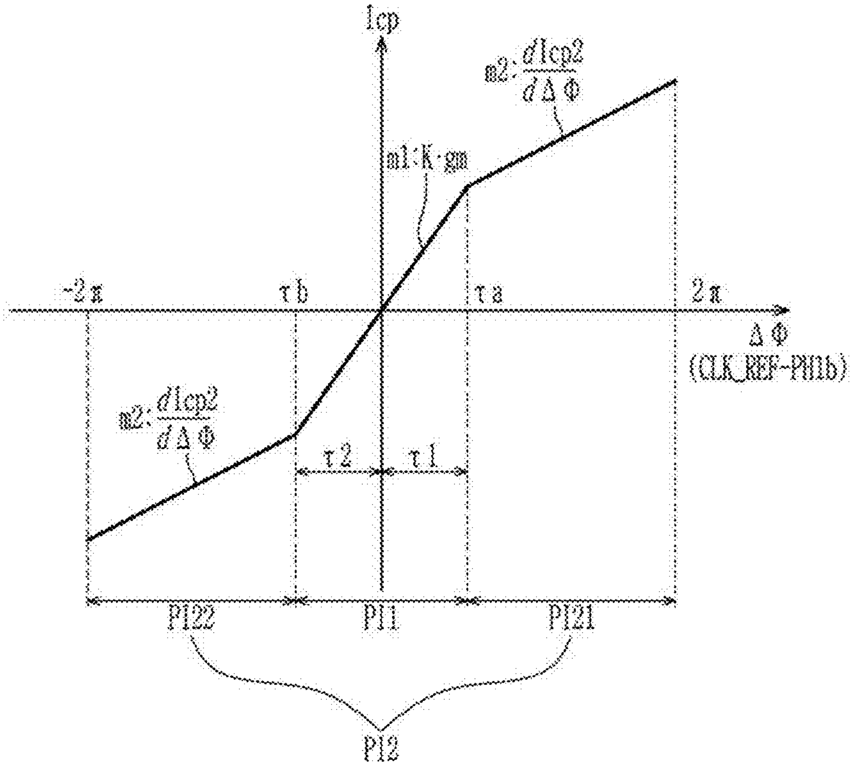
FIG. 12 is a graph showing characteristics of conversion current with respect to phase difference according to embodiments.

FIG. 12 is a graph for explaining the characteristics of conversion current with respect to phase difference according to embodiments.

Referring to FIGS. 1 and 12, hereinafter, the conversion current Icp is described for each phase interval divided based on the phase difference (Δϕ) between the reference clock signal CLK_REF and the first inverted phase division signal PH1*b*.

Hereinafter, [−2π, 2π], which may be the entire interval for the phase difference Δϕ, may include the first phase interval PI1 and the second phase interval PI2.

In some embodiments, the first phase interval PI1 may be defined by the a-th threshold time constant ta and the b-th threshold time constant τb.

The b-th threshold time constant τb is less than 0, and the size of the b-th threshold time constant τb may correspond to the second threshold time constant τ2 of FIGS. 6 to 10.

The a-th threshold time constant ta may be greater than 0, and the size of the a-th threshold time constant ta may correspond to the first threshold time constant τ1 of FIGS. 6 to 10.

The second phase interval PI2 may be an interval other than the first phase interval PI1 in the total [−2π, 2π].

The second phase interval PI2 may include a 2_1 phase interval PI21 and a 2_2 phase interval PI22.

The 2_1 phase interval PI21 may correspond to a phase lag when the phase difference Δϕ in the second phase interval PI2 is greater than 0.

In some embodiments, the 2_1 phase interval PI21 may be [τ1, 2π].

The 2_2 phase interval PI22 may correspond to a phase lead when the phase difference Δϕ in the second phase interval PI2 is less than 0.

In some embodiments, the 2_2 phase interval (PI22) may be [−2π, τ2].

If the phase difference Δϕ between the reference clock signal CLK_REF and the first inverted phase division signal PH1*b* is 0, the magnitude of the conversion current Icp may be 0, and the size of the sampling voltage in the sampling phase frequency detector 10 may match the reference voltage Vref in FIG. 6.

At this time, the main loop may be phase-locked.

In some embodiments, the conversion current Icp in the first phase interval PI1 may vary according to the first slope (m1) according to Equation 1 below.

$$m1 = K \cdot gm \qquad \text{Equation 1}$$

In Equation 1, m1 is the slope for the conversion current Icp that varies depending on the phase difference Δϕ in the first phase interval PI1, and K is the edge slope for the sampling voltage in the sampling phase frequency detector 10, and gm is the transconductance coefficient in the transconductance circuit 20.

In the first phase interval PI1, the conversion current Icp may vary linearly depending on the magnitude of the sampling voltage and the transconductance coefficient in the transconductance circuit 20.

In the first phase interval PI1, the conversion current Icp may be determined by the first conversion current Icp1 output from the transconductance circuit 20.

In some embodiments, the first conversion current Icp1 may vary linearly with the conversion current Icp.

In the first phase interval PI1, if the phase difference Δϕ between the reference clock signal CLK_REF and the first inverted phase division signal PH1*b* is greater than 0, the conversion current Icp may be greater than 0.

If the phase difference Δϕ between the reference clock signal CLK_REF and the first inverted phase division signal PH1*b* is less than 0, the conversion current Icp may be less than 0.

At this time, the fact that the conversion current Icp is less than 0 may mean that the conversion current Icp flows in the opposite direction.

In some embodiments, the conversion current Icp in the second phase interval PI2 may vary according to the second slope (m2) according to Equation 2 below.

$$m2 = \frac{dIcp2}{d\Delta\phi} \quad \text{Equation 2}$$

In Equation 2, where m2 is the slope for the conversion current Icp that varies with the variation of the phase difference Δϕ in the second phase interval PI2, ϕ*0* is the phase difference Δϕ between the reference clock signal CLK_REF and the first inverted phase division signal PH1*b*, and Icp2 is the second conversion current Icp2 output from the charge pump 30.

In the second phase interval PI2, the conversion current Icp may be changed by the second conversion current Icp2 output from the charge pump 30.

In the second phase interval PI2, the conversion current Icp is input to the charge pump 30 and the first and second status signals UP_SS and DN_SS whose pulse width varies depending on the phase difference Δϕ and the first and the first and second supply voltages Vdd and Vss output from the sampling phase frequency detector 10 along with the second status signals UP_SS and DN_SS.

In the 2_1 phase interval PI21, the sampling phase frequency detector 10 may output a first supply voltage Vdd, the transconductance circuit 20 may output a voltage greater than 0 based on the first supply voltage Vdd, and the first conversion current Icp1 may be output.

In addition, in the 2_1 phase interval PI21, the sampling phase frequency detector 10 outputs the first status signal UP_SS, and the charge pump 30 outputs a second conversion current Icp2 greater than zero based on the first status signal UP_SS.

In the 2_2 phase interval PI22, the sampling phase frequency detector 10 may output a second supply voltage Vss, the transconductance circuit 20 may output a voltage less than 0 based on the second supply voltage Vss, and the first conversion current Icp1 may be output.

In addition, in the 2_2 phase interval PI22, the sampling phase frequency detector 10 outputs the second status signal DN_SS, and the charge pump 30 outputs a second conversion current Icp2 greater than zero based on the first status signal DN_SS.

At this time, the first and second conversion currents Icp1 and Icp2 being less than 0 may mean that the first and second conversion currents Icp1 and Icp2 flow in opposite directions.

In the second phase interval PI2, through the sampling phase frequency detector 10 and the charge pump 30, as the phase difference Δϕ changes, the conversion current Icp may change to a proportional gain.

The conversion current Icp may have a proportional gain at [−2π, 2π].

Through the proportional gain, the phase-locked loop device 1 may have a fast locking time in the second phase interval PI2 as in the first phase interval PI1.

In some embodiments, at [−2π, 2π] for the phase difference Δϕ, the phase difference Δϕ and the conversion current Icp may have a one-to-one correspondence with each other.

Figure 13:
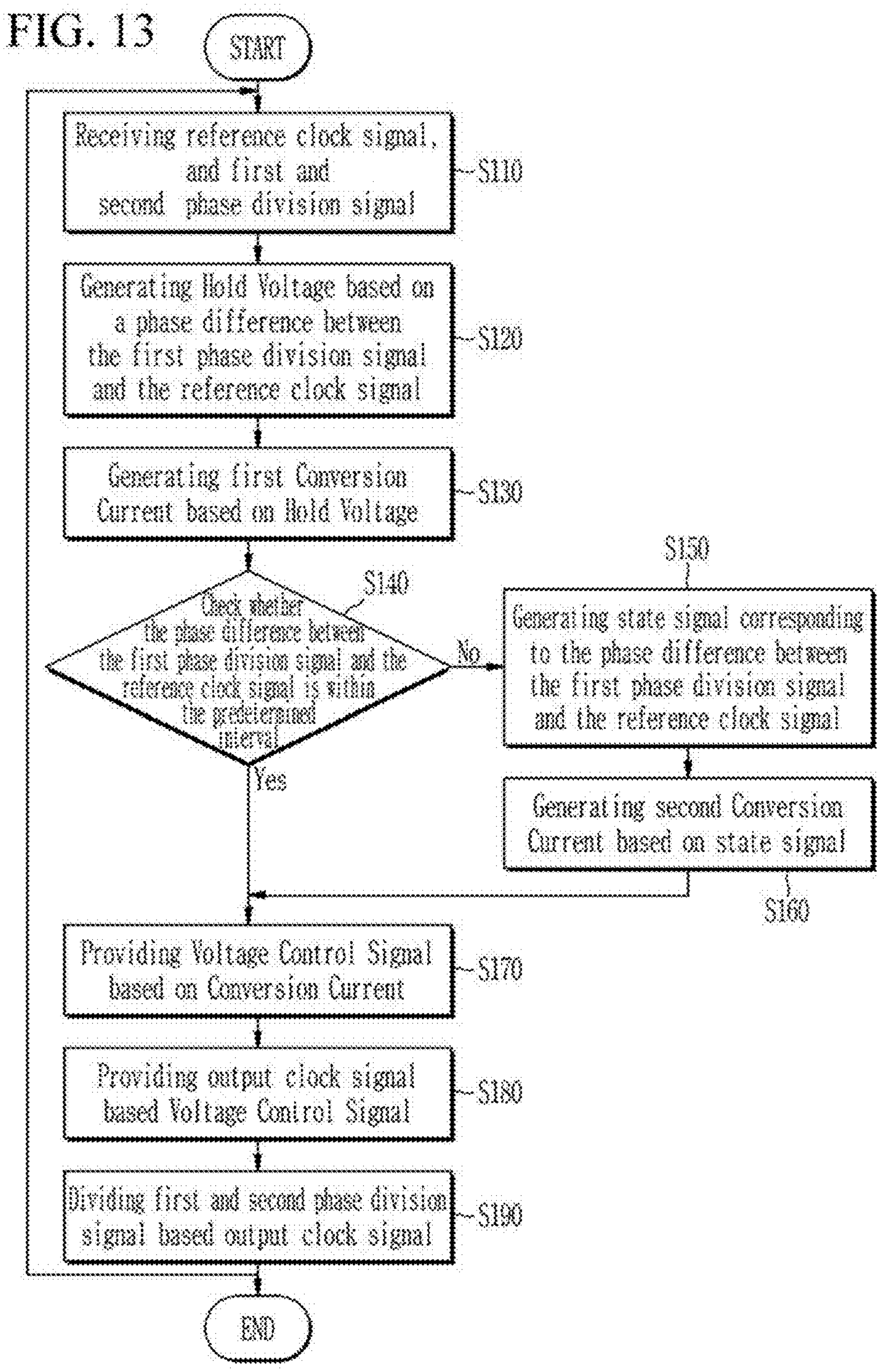
FIG. 13 is a flowchart illustrating a method of operating a phase-locked loop device according to an embodiment.

FIG. 13 is a flowchart illustrating a method of operating a phase-locked loop device according to an embodiment.

Referring to FIGS. 1 to 5 and FIG. 13, the operating method of the phase-locked loop device 1 may be a method for synchronizing the output clock signal CLK_OUT to the desired target frequency and phase.

The sampling phase frequency detector 10 receives the first and second phase division signals PH1 and PH2 divided from the reference clock signal CLK_REF and the output clock signal CLK_OUT at operation S110.

The sampling phase frequency detector 10 generates a hold voltage Vhold based on the phase difference between the reference clock signal CLK_REF and the first phase division signal PH1 at operation S120.

An example of operation S120 is described below in the description of FIG. 14.

The sampling phase frequency detector 10 generates a hold voltage Vhold based on the phase difference between the reference clock signal CLK_REF and the first phase division signal PH1 at operation S120.

The transconductance circuit 20 generates the first conversion current Icp1 based on the hold voltage Vhold at operation S130.

According to some embodiments, operation S130 may correspond to the description above with reference to FIG. 11.

The sampling phase frequency detector 10 checks whether the phase difference between the reference clock signal CLK_REF and the first phase division signal PH1 is within a predetermined range at operation S140.

The predetermined interval may correspond to the first phase interval PI1 of FIG. 12.

In some embodiments, the sampling phase frequency detector 10 may check whether the phase difference between the reference clock signal CLK_REF and the first phase division signal PH1 is included in the predetermined first phase interval PI1 at operation S140.

In embodiments, operation S140 may correspond to the description above with reference to FIGS. 6 to 10, corresponding to the falling edge of the first phase division signal PH1, the rising edge of the first adjustment clock signal CLK_A1, and the second adjustment clock. This may be confirmed by comparing the rising edge of the signal CLK_A2.

In some embodiments, the falling edge of the first phase division signal PH1, which may be the sampling point of the sampling phase detection circuit SPDC, may be the difference between the rising edge of the second adjustment clock signal CLK_A2 and rising edge of the second adjustment clock signal CLK_A2. When formed between rising edges, this may mean that the phase difference between the reference clock signal CLK_REF and the first phase division signal PH1 is included in the predetermined first phase interval PI1.

In embodiments, this may mean that the phase difference between the reference clock signal CLK_REF and the first phase division signal PH1 is included in the second phase interval PI2 of the 12, outside the predetermined first phase interval PI1, either when the falling edge of the first phase division signal PH1 is ahead of the rising edge of the second adjustment clock signal CLK_A2, or when the falling edge of the first phase division signal PH1 is behind the rising edge of the first adjustment clock signal CLK_A1.

Depending on the result of operation S140, it may be determined whether to output the first and second status signals UP_SS and DN_SS of the sampling phase frequency detector 10.

If the phase difference between the reference clock signal CLK_REF and the first phase division signal PH1 is not included in a predetermined interval, the sampling phase frequency detector 10 generates a status signal (e.g., the first and second status signals UP_SS and DN_SS) corresponding to the phase difference at operation S150.

In embodiments, operation S150 may correspond to the description above with reference to FIGS. 8 and 10.

In some embodiments, when the falling edge of the first phase division signal PH1 precedes the rising edge of the second adjustment clock signal CLK_A2, the sampling phase frequency detector 10 may generate the second status signal DN_SS.

In some embodiments, when the falling edge of the first phase division signal PH1 lags behind the rising edge of the first adjustment clock signal CLK_A1, the sampling phase frequency detector 10 generates the first status signal UP_SS.

The charge pump 30 generates the second conversion current Icp2 based on the first and second status signals UP_SS and DN_SS at operation S160.

The charge pump 30 may adjust the direction and size of the second conversion current Icp2 according to the type and pulse width of the input status signals UP_SS and DN_SS.

In the drawing, operation S130 is illustrated as preceding operations S140 to S160, but in some embodiments, operations S140 and step S150 may be performed together with operation S120 prior to operation S130.

Additionally, in some embodiments, operations S130 and S160 may be performed simultaneously.

The loop filter 50 provides a voltage control signal VCTRL to the voltage-controlled oscillator 60 based on the conversion current Icp, which is the sum of the first conversion current Icp1 and the second conversion current Icp2 at operation S170.

In some embodiments, if it is confirmed at operation S140 that the phase difference between the reference clock signal CLK_REF and the first phase division signal PH1 is included in the first phase interval PI1 of FIG. 12, the loop filter 50 may provide a voltage control signal VCTRL to the voltage-controlled oscillator 60 based on the first conversion current Icp1.

In some embodiments, if it is confirmed at operation S140 that the phase difference between the reference clock signal CLK_REF and the first phase division signal PH1 is included in the first phase interval PI1 of FIG. 12, the size of the second conversion current Icp2 may be 0.

The voltage-controlled oscillator 60 provides the output clock signal CLK_OUT to the divider 70 based on the voltage control signal VCTRL at operation S180.

The divider 70 divides the output clock signal CLK_OUT into the first and second phase division signals PH1 and PH2 at operation S190.

Thereafter, the sampling phase frequency detector 10 may receive the first and second phase division signals PH1 and PH2 as feedback signals from the divider 70.

The phase-locked loop device 1 may repeatedly perform operations S110 to S190 in one loop.

Through the above operations of the sampling phase frequency detector 10, the transconductance circuit 20, the charge pump 30, the loop filter 50, the voltage-controlled oscillator 60, and the divider 70, the output clock signal CLK_OUT may be synchronized to the target frequency and phase.

In some embodiments, the phase-locked loop device 1 may repeatedly perform operations S110 to S190 until the hold voltage Vhold generated by the sampling phase frequency detector 10 matches the reference voltage Vref.

Figure 14:
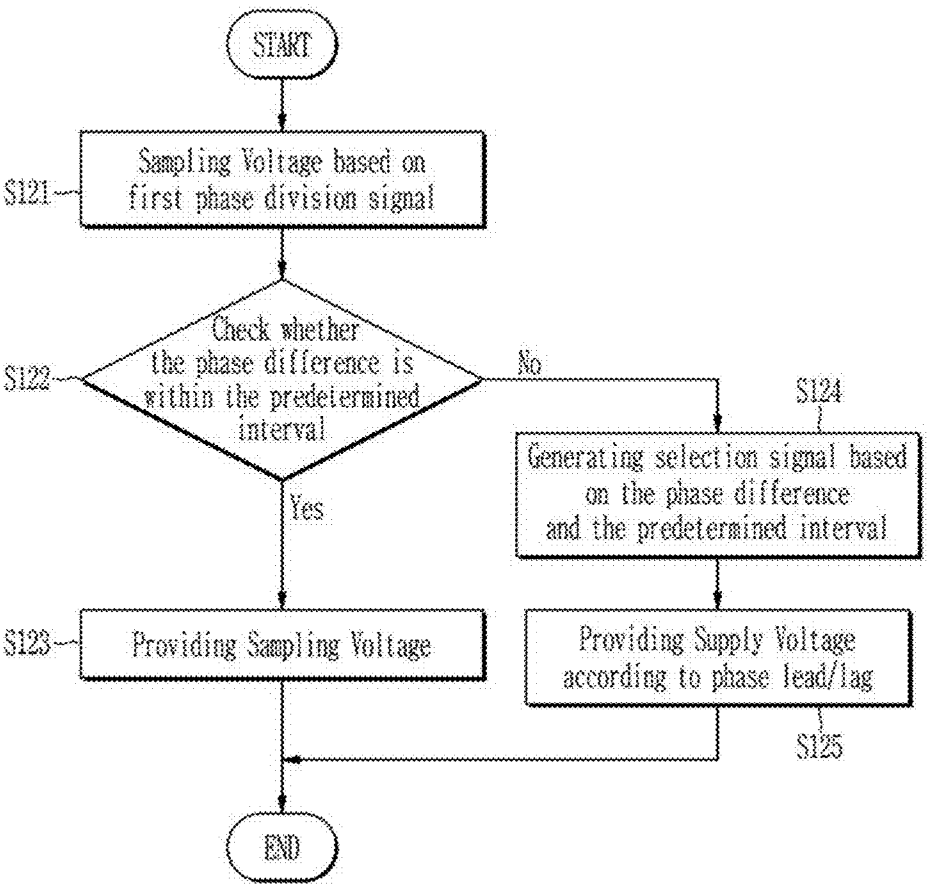
FIG. 14 is a flowchart illustrating steps for generating a hold voltage at a hold node according to embodiments.

FIG. 14 is a flowchart illustrating steps for generating a hold voltage at a hold node according to embodiments.

Referring to FIGS. 1 to 5 and FIGS. 13 and 14, step S120 according to embodiments may include operations S121 to S125.

The sampling phase detection circuit SPDC samples the voltage based on the first phase division signal PH1 at operation S121.

At operation S121, the first switch SW1 of the sampling phase detection circuit SPDC connects the sampling node SN and the charge node CN in response to the first phase division signal PH1 between the sampling node SN and the charge node CN.

When the first phase division signal PH1 has a first logic level, the first switch SW1 is turned on, and the sampling voltage generated at the sampling node SN is applied to the charge node CN.

The sampling phase frequency detector 10 checks whether the phase difference between the reference clock signal CLK_REF and the first phase division signal PH1 is within a predetermined range at operation S122.

In some embodiments, operation S122 may be performed similarly to S140 of FIG. 13, and may be performed simultaneously.

In some embodiments operation S122 may be replaced with operation S140.

The predetermined interval may correspond to the first phase interval PI1 of FIG. 12.

Depending on the result of the confirmation at operation S122, it may be determined whether to output the first logic level for the first and second selection signals UP_FLL and DN_FLL of the sampling phase frequency detector 10.

Depending on whether the first and second selection signals UP_FLL and DN_FLL are output at the first logic level, the first logic level output of the third selection signal SPD may also be determined.

The level of one of the first to third selection signals UP_FLL, DN_FLL, and SPD may be a first logic level, and the level of the remaining selection signals may be a second logic level.

When it is confirmed that the phase difference between the reference clock signal CLK_REF and the first phase division signal PH1 is within a predetermined range, the sampling voltage is provided as a hold voltage Vhold at operation S123.

When it is confirmed that the phase difference between the reference clock signal CLK_REF and the first phase division signal PH1 is within a predetermined interval, the first and second selection signals UP_FLL and DN_FLL may have a second logic level.

Accordingly, the third selection signal SPD may have a first logic level.

According to the third switching signal PH2_SPD according to the third selection signal SPD, the sampling phase frequency detector 10 may provide the sampling voltage as the hold voltage Vhold.

When the phase difference between the reference clock signal CLK_REF and the first phase division signal PH1 is not within a predetermined interval, the sampling phase frequency detector 10 generates the first and second selection signals UP_FLL and DN_FLL at operation S124.

In embodiments, operation S124 may correspond to the description of FIGS. 8 and 10.

In some embodiments, when the falling edge of the first phase division signal PH1 is ahead of the rising edge of the second adjustment clock signal CLK_A2, the second selection signal DN_FLL may have a first logic level.

In embodiments, if the falling edge of the first phase division signal PH1 is delayed compared to the rising edge of the first adjustment clock signal CLK_A1, the sampling phase frequency detector 10 may have the first selection signal UP_FLL at the first logic level.

The sampling phase frequency detector 10 provides the supply voltages (Vdd, Vss) as the hold voltage Vhold according to the phase lead state and phase lag state at operation S125.

In some embodiments, when the falling edge of the first phase division signal PH1 precedes the rising edge of the second adjustment clock signal CLK_A2, the phase is in a phase lead state and the second selection signal DN_FLL has the first logic level.

According to the second switching signal PH2_DN based on the second selection signal DN_FLL, the second supply voltage Vss may be transmitted as the hold voltage Vhold to the hold node HN.

In some embodiments, when the falling edge of the first phase division signal PH1 lags behind the rising edge of the first adjustment clock signal CLK_A1, the phase is in a phase lag state and the first selection signal UP_FLL has the first logic level.

According to the first switching signal PH2_UP based on the first selection signal UP_FLL, the first supply voltage Vdd may be transmitted as the hold voltage Vhold to the hold node HN.

The phase-locked loop device 1 may operate as described above in FIGS. 13 and 14 to have a proportional gain for the phase difference between the reference clock signal CLK_REF and the first phase division signal PH1 in the entire [−2π, 2π] interval.

Accordingly, the phase-locked loop device 1 may have a fast fixation time in the entire [−2π, 2π] interval using only the main loop without a separate loop.

Figure 15:
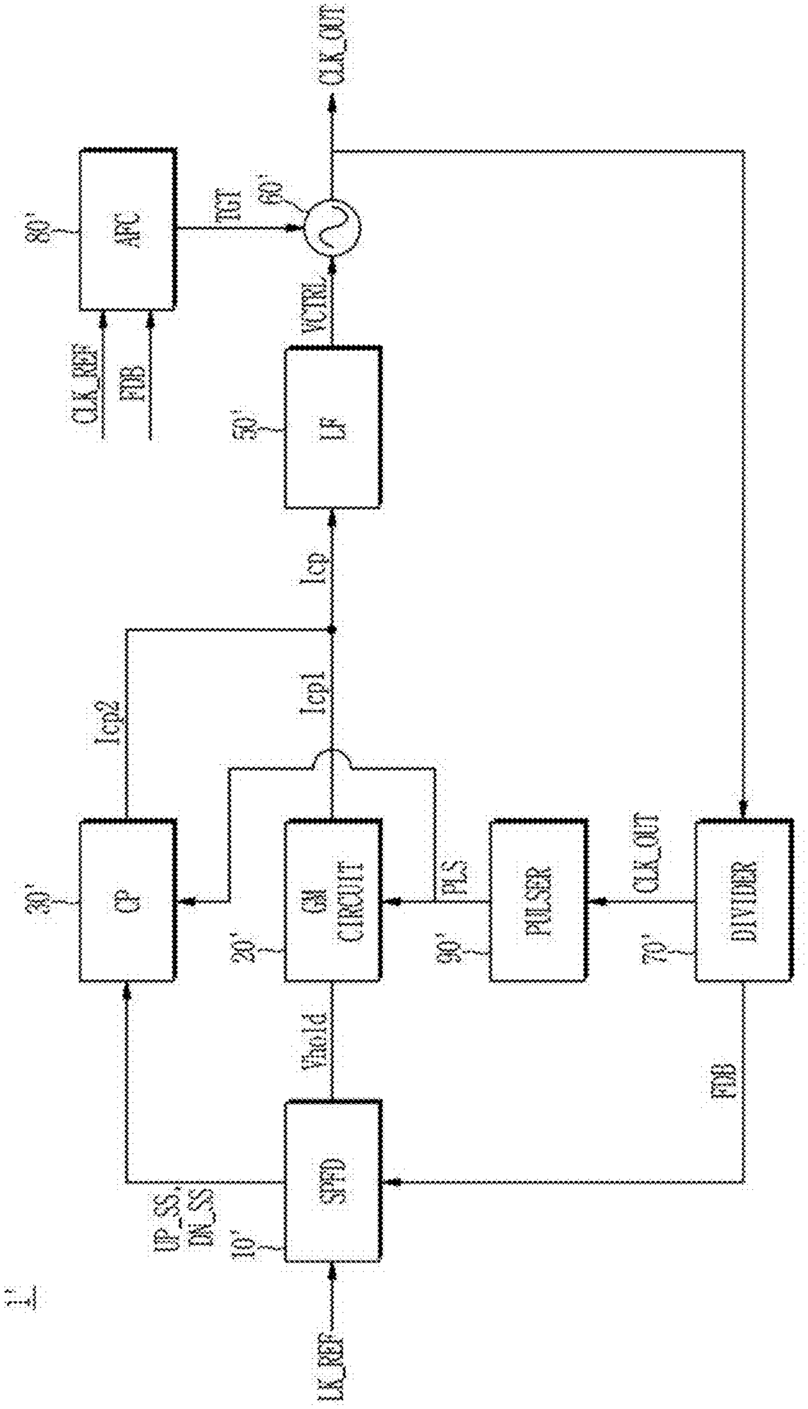
FIG. 15 is a block diagram showing a phase-locked loop device according to an embodiment.

FIG. 15 is a block diagram showing a phase-locked loop device according to an embodiment.

Figure 16:
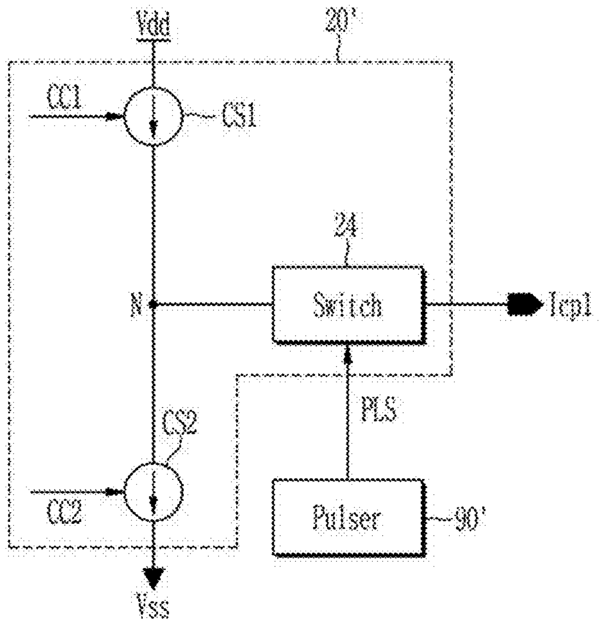
FIG. 16 is a diagram showing the transconductance circuit and pulse generator shown in FIG. 15.

FIG. 16 is a diagram for explaining the transconductance circuit and pulse generator shown in FIG. 15.

As shown in FIG. 15 and FIG. 16, the phase-locked loop device 1' may include a sampling phase frequency detector 10' (illustrated as "SPFD"), a transconductance circuit 20' (illustrated as "GM CIRCUIT"), a charge pump 30', a loop filter 50', a voltage-controlled oscillator 60', a divider 70', an automatic frequency calibrator (AFC) 80', and a pulser 90'.

The sampling phase frequency detector 10', the transconductance circuit 20', the charge pump 30', the loop filter 50', the voltage-controlled oscillator 60', and the divider 70' may respectively correspond to the sampling phase frequency detector 10, the transconductance circuit 20, the charge pump 30, the loop filter 50, the voltage-controlled oscillator 60, and the divider 70, as described above in FIGS. 1 through 10, and redundant or duplicative description may be omitted.

In order to facilitate the description below, the description of the components of FIGS. 15 and 16 will focus on the differences between FIGS. 1 to 10.

The sampling phase frequency detector 10', the transconductance circuit 20', the charge pump 30', the loop filter 50', the voltage-controlled oscillator 60', the divider 70', the AFC 80', and the pulser 90' may operate as the main loop.

The AFC 80' may generate a target signal TGT for adjusting the frequency of the output clock signal CLK-_OUT based on the reference clock signal CLK_REF and the feedback signal FDB.

In embodiments, the feedback signal FDB output from the divider 70' may correspond to the first and second phase division signals PH1 and PH2 in FIGS. 1 to 10.

In embodiments, the feedback signal FDB output from the divider 70' may be a signal obtained by dividing the output clock signal CLK_OUT by M times.

The pulser 90' may provide a pulse signal PLS having a pulse width based on the output clock signal CLK_OUT to the transconductance circuit 20' and the charge pump 30'.

The pulser 90' may also be referred to as a pulse generator.

The transconductance circuit 20' and the charge pump 30' may output a first conversion current Icp1 and a second conversion current Icp2, respectively, during an interval corresponding to the pulse width of the pulse signal PLS.

The first conversion current Icp1 and the second conversion current Icp2 may be adjusted according to the pulse signal PLS of the pulser 90'.

When the pulser 90' is included in the phase-locked loop device 1', there are advantages of securing the desired bandwidth and phase margin and reducing phase noise.

Regarding the transconductance circuit 20' and the charge pump 30', these elements may further include switches. For example, in comparison to the transconductance circuit 20 described above with reference to FIGS. 1 to 10, the transconductance circuit 20' may further include a switch 24.

The switch 24 may be connected between the node N and the output terminal where the first conversion current Icp1 is output, and the switch 24 may connect the node N and the output terminal in response to the pulse signal PLS output from the pulser 90'.

In embodiments, the switch 24 may be turned on and the first conversion current Icp1 may be output only while the pulse signal PLS has a pulse width of a certain logic level.

The switch 24 may be implemented using a transistor, but embodiments are not limited thereto.

Similarly, the charge pump 30' according to the embodiment may further include a switch connected to the output terminal and receiving the pulse signal PLS from the pulser 90'.

The switch may output a second conversion current Icp2 to an output terminal in response to the pulse signal PLS.

The switch may be implemented using a transistor, but embodiments are not limited thereto.

Figure 17:
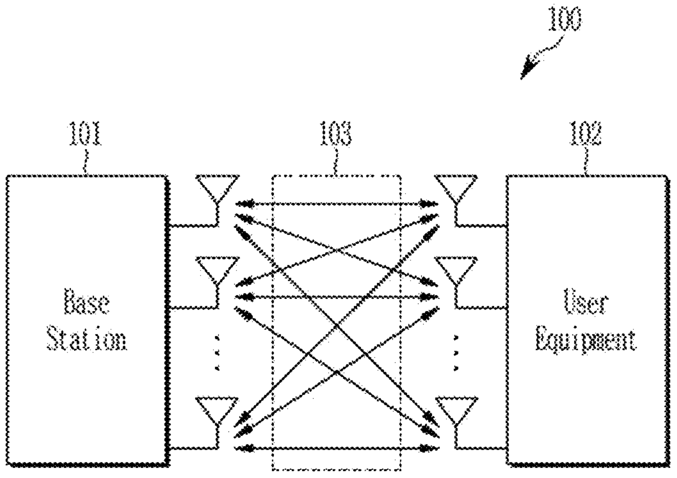
FIG. 17 is a block diagram showing a wireless communication system according to embodiments.

FIG. 17 is a block diagram showing a wireless communication system according to embodiments.

Specifically, FIG. 17 shows an embodiment in which a base station 101 and a user device 102 communicate wirelessly in a wireless communication system 100 using a cellular network.

The wireless communication system 100 may define a high carrier frequency, and the base station 101 and user device 102 may include a phase-locked loop device according to embodiments described above.

The base station 101 and the user device 102 may include the phase-locked loop device to improve area overhead while providing a wide lock range and improved lock time for signals containing high carrier frequencies, etc.

The base station 101 may be a fixed station that communicates with user devices and/or other base stations.

For example, the base station 101 may be, or may include, at least one of a node B, an evolved-node B (eNB), a sector, a site, a base transceiver system (BTS), an access point (AP), and a relay node, and may be referred to as a remote radio head (RRH), radio unit (RU), small cell, etc.

The user device 102 may be fixed or mobile, and may communicate with a base station to transmit and receive data and/or control information.

For example, the user device 102 may be, or may include, a terminal equipment, a mobile station (MS), a mobile terminal (MT), a user terminal (UT), a subscribe station (SS), a wireless device, or a portable device, and it may be referred to as a handheld device, etc.

As shown in FIG. 17, the base station 101 and the user device 102 may each include a plurality of antennas and may communicate wirelessly through a multiple input multiple output (MIMO) channel 103.

Although some embodiments have been described in detail above, the scope of the disclosure is not limited thereto, and various modifications and improvements made by those skilled in the art may also be included in the scope of the disclosure.

What is claimed is:

1. A phase-locked loop device, comprising:
- a voltage-controlled oscillator configured to generate an output clock signal;
- a divider configured to divide the output clock signal into a first phase division signal;
- a sampling phase frequency detector configured to:
  - receive a first supply voltage, a second supply voltage different from the first supply voltage, and the first phase division signal, and
  - based on determining that a phase difference between the first phase division signal and a reference clock signal corresponds to a first interval, output a hold voltage based on the first supply voltage or the second supply voltage, and output a status signal for the phase difference;
- a transconductance circuit configured to output a first conversion current based on the hold voltage;
- a charge pump configured to output a second conversion current based on the status signal; and
- a loop filter configured to provide a voltage control signal corresponding to the first conversion current and the second conversion current to the voltage-controlled oscillator.

2. The phase-locked loop device of claim 1, wherein the status signal comprises a first status signal and a second status signal, and
- wherein the sampling phase frequency detector is further configured to:
  - based on determining that the phase difference corresponds to the first interval and a falling edge of the first phase division signal lags behind a rising edge of the reference clock signal, convert the first status signal into a pulse signal, and
  - based on determining that the phase difference corresponds to the first interval and the falling edge of the first phase division signal leads the rising edge of the reference clock signal, convert the second status signal into the pulse signal.

3. The phase-locked loop device of claim 2, wherein based on the sampling phase frequency detector outputting the first status signal, the sampling phase frequency detector is further configured to output the hold voltage based on the first supply voltage, and
- wherein a voltage level of the first supply voltage is higher than a voltage level of the second supply voltage.

4. The phase-locked loop device of claim 2, wherein based on the sampling phase frequency detector outputting the second status signal, the sampling phase frequency detector is further configured to output the second supply voltage, and
- wherein a voltage level of the second supply voltage is lower than a voltage level of the first supply voltage.

5. The phase-locked loop device of claim 2, wherein in a $[-2\pi, 2\pi]$ interval for the phase difference, the phase difference is in a one-to-one correspondence with a sum of the first conversion current and the second conversion current.

6. The phase-locked loop device of claim 1, wherein a second interval different from the first interval is defined by a first threshold time constant and a second threshold time constant at both ends,
- wherein the first threshold time constant is greater than 0, and
- wherein the second threshold time constant is less than 0.

7. The phase-locked loop device of claim 6, wherein the phase difference corresponds to an interval between a falling edge of the first phase division signal and a rising edge of the reference clock signal, and
- wherein based on the phase difference being within the second interval, the sampling phase frequency detector is further configured to output a voltage between the first supply voltage and the second supply voltage as a sampling voltage based on the phase difference.

8. The phase-locked loop device of claim 7, wherein the sampling phase frequency detector is further configured to: output the first supply voltage as the sampling voltage based on determining that the phase difference corresponds to the first threshold time constant, and
- output the second supply voltage as the sampling voltage based on determining that the phase difference corresponds to the second threshold time constant.

9. The phase-locked loop device of claim 8, wherein the second supply voltage comprises a ground voltage, and
- wherein a voltage level of the first supply voltage is higher than a voltage level of the second supply voltage.

10. The phase-locked loop device of claim 7, wherein based on determining that the phase difference corresponds to the second interval: the sampling phase frequency detector is further configured to not output the status signal and to provide the sampling voltage as the hold voltage to the transconductance circuit, and the first conversion current varies linearly according to the phase difference.

11. The phase-locked loop device of claim 1, wherein the transconductance circuit comprises:
- a current-providing circuit comprising a first current source and a second current source connected to a node at which the first conversion current is output; and
- a current control circuit configured to:

compare a magnitude of the hold voltage with a magnitude of a reference voltage to generate a comparison result; and generate a first current control signal for controlling the first current source and a second current control signal for controlling the second current source based on the comparison result.

12. The phase-locked loop device of claim 11, further comprising a pulse generator configured to provide a pulse signal with a pulse width based on the output clock signal to the transconductance circuit, and wherein the transconductance circuit is further configured to output the first conversion current in an interval corresponding to the pulse width.

13. A method for operating a phase-locked loop device, the method comprising:

receiving a reference clock signal and a first phase division signal divided from an output clock signal;

generating a hold voltage based on a phase difference between the first phase division signal and the reference clock signal;

generating a first conversion current based on the hold voltage;

generating a status signal based on whether the phase difference is included in a predetermined interval;

generating a second conversion current based on the status signal;

providing a voltage control signal based on a conversion current including the first conversion current and the second conversion current; and providing the output clock signal based on the voltage control signal.

14. The method of claim 13, wherein the generating the hold voltage comprises:

generating a selection signal based on whether the phase difference is included in the predetermined interval; and based on the selection signal, providing a supply voltage or performing a sampling operation to provide a sampling voltage.

15. The method of claim 14, wherein based on the phase difference being included in the predetermined interval, the sampling voltage is provided as the hold voltage, and the status signal is not output.

16. The method of claim 14, wherein based on the phase difference being not included in the predetermined interval, the supply voltage is provided as the hold voltage based on the selection signal, and the second conversion current is generated according to the status signal.

17. A phase-locked loop device, comprising:

a first circuit comprising:

a first flip-flop configured to output a first latch signal as a first selection signal based on a first adjustment clock signal, wherein a phase of the first adjustment clock signal is adjusted from a reference clock signal, a second flip-flop configured to output a second latch signal as a second selection signal based on a second adjustment clock signal, wherein a phase of the second adjustment clock signal is adjusted from the reference clock signal, a first AND gate configured to perform an AND operation on the first latch signal and the first selection signal to output a first status signal, a second AND gate configured to perform an AND operation on the second latch signal and the second selection signal to output a second status signal, and a NOR gate configured to perform a NOR operation on the first selection signal and the second selection signal to output a third selection signal;

a second circuit comprising:

a sampling phase detection circuit configured to provide a sampling voltage to a hold node based on the third selection signal, an up switch configured to provide a first supply voltage to the hold node based on the first selection signal, and a down switch configured to provide a second supply voltage different from the first supply voltage to the hold node based on the second selection signal; and a charge pump configured to output at least a portion of a conversion current based on the first status signal and the second status signal.

18. The phase-locked loop device of claim 17, wherein the first circuit further comprises:

a third flip-flop configured to latch the first supply voltage into the first latch signal based on the reference clock signal;

a fourth flip-flop configured to latch the first supply voltage into the second latch signal based on a falling edge of a phase division signal based on an output clock signal; and a third AND gate configured to perform an AND operation on the first latch signal and the second latch signal to provide a reset signal to the third flip-flop and the fourth flip-flop.

19. The phase-locked loop device of claim 17, wherein the first circuit further comprises:

a first phase adjustment circuit configured to delay the reference clock signal and output the first adjustment clock signal; and a second phase adjustment circuit configured to delay an inverted signal of the reference clock signal and output the second adjustment clock signal.

20. The phase-locked loop device of claim 17, wherein based on the first selection signal having a first logic level, the second selection signal and the third selection signal have a second logic level different from the first logic level.

* * * * *